(12) United States Patent
Forbes et al.

(10) Patent No.: US 7,994,595 B2
(45) Date of Patent: Aug. 9, 2011

(54) STRAINED SEMICONDUCTOR BY FULL WAFER BONDING

(75) Inventors: Leonard Forbes, Corvallis, OR (US); Joseph E. Geusic, Berkeley Heights, NJ (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 877 days.

(21) Appl. No.: 11/475,798

(22) Filed: Jun. 27, 2006

(65) Prior Publication Data

US 2006/0244105 A1 Nov. 2, 2006

Related U.S. Application Data

(62) Division of application No. 10/623,788, filed on Jul. 21, 2003, now Pat. No. 7,439,158.

(51) Int. Cl.
*H01L 29/76* (2006.01)
*H01L 29/32* (2006.01)
(52) U.S. Cl. .................. 257/419; 257/618; 257/288
(58) Field of Classification Search .................. None
See application file for complete search history.

(56) References Cited

U.S. PATENT DOCUMENTS

| 4,241,359 | A | 12/1980 | Izumi et al. |
|---|---|---|---|
| 4,314,595 | A | 2/1982 | Yamamoto et al. |
| 4,322,980 | A | 4/1982 | Suzuki et al. |
| 4,589,928 | A | 5/1986 | Dalton et al. |
| 4,996,627 | A | 2/1991 | Zias et al. |
| 5,063,113 | A | 11/1991 | Wada |
| 5,234,535 | A | 8/1993 | Beyer et al. |
| 5,426,061 | A | 6/1995 | Sopori |
| 5,441,591 | A | 8/1995 | Imthurn et al. |
| 5,661,044 | A | 8/1997 | Holland et al. |
| 5,679,475 | A | 10/1997 | Yamagata et al. |
| 5,684,997 | A | 11/1997 | Kau et al. |
| 5,840,590 | A | 11/1998 | Myers, Jr. et al. |
| 5,858,819 | A | 1/1999 | Miyasaka |

(Continued)

FOREIGN PATENT DOCUMENTS

EP 434984 9/1991

(Continued)

OTHER PUBLICATIONS

Sato, T., et al., "SON (Silicon on Nothing) MOSFET using ESS (Empty Space in Silicon) technique for SoC applications", *IEDM Technical Digest. International Electron Devices Meeting*, (2001), 37.1.1.-37.1.4.

(Continued)

*Primary Examiner* — Mary Wilczewski
*Assistant Examiner* — Pamela E Perkins
(74) *Attorney, Agent, or Firm* — Schwegman, Lundberg & Woessner, P.A.

(57) ABSTRACT

One aspect of this disclosure relates to a method for forming a wafer with a strained semiconductor. In various embodiments of the method, a predetermined contour is formed in one of a semiconductor membrane and a substrate wafer. The semiconductor membrane is bonded to the substrate wafer and the predetermined contour is straightened to induce a predetermined strain in the semiconductor membrane. In various embodiments, a substrate wafer is flexed into a flexed position, a portion of the substrate wafer is bonded to a semiconductor layer when the substrate wafer is in the flexed position, and the substrate wafer is relaxed to induce a predetermined strain in the semiconductor layer. Other aspects and embodiments are provided herein.

20 Claims, 18 Drawing Sheets

U.S. PATENT DOCUMENTS

| | | |
|---|---|---|
| 5,877,070 A | 3/1999 | Goesele et al. |
| 5,879,996 A | 3/1999 | Forbes |
| 5,963,817 A | 10/1999 | Chu et al. |
| 6,022,793 A | 2/2000 | Wijaranakula et al. |
| 6,083,324 A | 7/2000 | Henley et al. |
| 6,093,623 A | 7/2000 | Forbes |
| 6,096,433 A | 8/2000 | Kikuchi et al. |
| 6,103,598 A | 8/2000 | Yamagata et al. |
| 6,107,661 A | 8/2000 | Okabe et al. |
| 6,136,666 A | 10/2000 | So |
| 6,143,628 A | 11/2000 | Sato et al. |
| 6,174,784 B1 | 1/2001 | Forbes |
| 6,204,145 B1 | 3/2001 | Noble |
| 6,228,694 B1 | 5/2001 | Doyle et al. |
| 6,242,324 B1 | 6/2001 | Kub et al. |
| 6,251,751 B1 | 6/2001 | Chu et al. |
| 6,261,876 B1 | 7/2001 | Crowder et al. |
| 6,271,273 B1 | 8/2001 | You et al. |
| 6,309,950 B1 | 10/2001 | Forbes |
| 6,315,826 B1 | 11/2001 | Muramatsu |
| 6,328,796 B1 | 12/2001 | Kub et al. |
| 6,338,805 B1 | 1/2002 | Anderson |
| 6,339,011 B1 | 1/2002 | Gonzalez et al. |
| 6,377,070 B1 | 4/2002 | Forbes |
| 6,383,924 B1 | 5/2002 | Farrar et al. |
| 6,424,001 B1 | 7/2002 | Forbes et al. |
| 6,448,601 B1 | 9/2002 | Forbes et al. |
| 6,455,397 B1 | 9/2002 | Belford |
| 6,461,933 B2 | 10/2002 | Houston |
| 6,478,883 B1 | 11/2002 | Tamatsuka et al. |
| 6,486,008 B1 | 11/2002 | Lee |
| 6,496,034 B2 | 12/2002 | Forbes et al. |
| 6,497,763 B2 | 12/2002 | Kub et al. |
| 6,514,836 B2 | 2/2003 | Belford |
| 6,515,335 B1 | 2/2003 | Christiansen et al. |
| 6,531,727 B2 | 3/2003 | Ahn et al. |
| 6,538,330 B1 | 3/2003 | Forbes |
| 6,541,356 B2 | 4/2003 | Fogel et al. |
| 6,559,491 B2 | 5/2003 | Forbes et al. |
| 6,566,682 B2 | 5/2003 | Forbes |
| 6,582,512 B2 | 6/2003 | Geusic et al. |
| 6,583,437 B2 | 6/2003 | Mizuno et al. |
| 6,597,203 B2 | 7/2003 | Forbes |
| 6,649,476 B2 | 11/2003 | Forbes |
| 6,649,492 B2 | 11/2003 | Chu et al. |
| 6,657,276 B1 | 12/2003 | Karlsson et al. |
| 6,689,671 B1 | 2/2004 | Yu et al. |
| 6,703,293 B2 | 3/2004 | Tweet et al. |
| 6,703,648 B1 | 3/2004 | Xiang et al. |
| 6,717,216 B1 | 4/2004 | Doris et al. |
| 6,740,913 B2 | 5/2004 | Doyle et al. |
| 6,825,102 B1 | 11/2004 | Bedell et al. |
| 6,855,649 B2 | 2/2005 | Christiansen et al. |
| 6,900,094 B2 | 5/2005 | Hammond et al. |
| 6,902,616 B1 | 6/2005 | Yamazaki et al. |
| 6,987,037 B2 | 1/2006 | Forbes |
| 6,994,762 B2 | 2/2006 | Clingman et al. |
| 7,008,854 B2 | 3/2006 | Forbes |
| 7,023,051 B2 | 4/2006 | Forbes |
| 7,041,575 B2 | 5/2006 | Forbes |
| 7,045,874 B2 | 5/2006 | Forbes |
| 7,054,532 B2 | 5/2006 | Forbes et al. |
| 7,081,395 B2 | 7/2006 | Chi et al. |
| 7,084,429 B2 | 8/2006 | Forbes |
| 7,115,480 B2 | 10/2006 | Forbes |
| 7,142,577 B2 | 11/2006 | Geusic et al. |
| 7,153,753 B2 | 12/2006 | Forbes |
| 7,198,974 B2 | 4/2007 | Forbes |
| 7,202,530 B2 | 4/2007 | Forbes |
| 7,220,656 B2 | 5/2007 | Forbes |
| 7,271,445 B2 | 9/2007 | Forbes |
| 7,273,788 B2 | 9/2007 | Forbes |
| 7,394,111 B2 | 7/2008 | Forbes |
| 7,405,444 B2 | 7/2008 | Forbes |
| 7,429,763 B2 | 9/2008 | Forbes |
| 7,439,158 B2 | 10/2008 | Forbes et al. |
| 7,482,190 B2 | 1/2009 | Forbes |
| 7,485,544 B2 | 2/2009 | Forbes et al. |
| 7,504,310 B2 | 3/2009 | Forbes |
| 7,528,463 B2 | 5/2009 | Forbes |
| 7,662,701 B2 | 2/2010 | Forbes |
| 7,687,329 B2 | 3/2010 | Forbes |
| 2002/0001965 A1 | 1/2002 | Forbes |
| 2002/0070421 A1 | 6/2002 | Ashburn |
| 2002/0185686 A1 | 12/2002 | Christiansen et al. |
| 2003/0131782 A1 | 7/2003 | Geusic et al. |
| 2003/0181018 A1 | 9/2003 | Geusic et al. |
| 2003/0190796 A1 | 10/2003 | Geusic |
| 2003/0227072 A1 | 12/2003 | Forbes |
| 2004/0048450 A1 | 3/2004 | Tweet et al. |
| 2004/0176483 A1 | 9/2004 | Geusic |
| 2004/0214366 A1 | 10/2004 | Segal et al. |
| 2004/0217352 A1 | 11/2004 | Forbes |
| 2004/0217391 A1 | 11/2004 | Forbes |
| 2004/0224480 A1 | 11/2004 | Forbes |
| 2004/0232487 A1 | 11/2004 | Forbes |
| 2004/0232488 A1 | 11/2004 | Forbes |
| 2005/0020094 A1 | 1/2005 | Forbes et al. |
| 2005/0023529 A1 | 2/2005 | Forbes |
| 2005/0023612 A1 | 2/2005 | Forbes |
| 2005/0023616 A1 | 2/2005 | Forbes |
| 2005/0029619 A1 | 2/2005 | Forbes |
| 2005/0032296 A1 | 2/2005 | Forbes |
| 2005/0070036 A1 | 3/2005 | Geusic et al. |
| 2005/0087842 A1 | 4/2005 | Forbes |
| 2005/0105869 A1 | 5/2005 | Forbes et al. |
| 2005/0250274 A1 | 11/2005 | Forbes et al. |
| 2005/0285139 A1 | 12/2005 | Forbes |
| 2006/0001094 A1 | 1/2006 | Forbes |
| 2006/0011982 A1 | 1/2006 | Forbes |
| 2006/0097281 A1 | 5/2006 | Forbes |
| 2006/0138708 A1 | 6/2006 | Geusic |
| 2006/0208343 A1 | 9/2006 | Forbes |
| 2006/0258063 A1 | 11/2006 | Forbes |
| 2006/0258123 A1 | 11/2006 | Forbes |
| 2006/0263994 A1 | 11/2006 | Forbes |
| 2006/0267152 A1 | 11/2006 | Forbes |
| 2007/0096193 A1 | 5/2007 | Forbes et al. |
| 2007/0164361 A1 | 7/2007 | Forbes |
| 2008/0029840 A1 | 2/2008 | Forbes et al. |
| 2009/0108363 A1 | 4/2009 | Forbes et al. |

FOREIGN PATENT DOCUMENTS

| | | |
|---|---|---|
| JP | 54-152464 A | 11/1979 |
| JP | 54-155770 A | 12/1979 |
| JP | 04-372152 * | 12/1992 |

OTHER PUBLICATIONS

"Cornell Demonstrates a Universal Substrate", *Compound Semiconductor*, 3(2), (Mar./Apr. 1997),27-29.

Abe, T , "Silicon Wafer-Bonding Process Technology for SOI Structures", *Extended Abstracts of the 22nd (1990 International) Conference on Solid State Devices and Materials*, (1990),853-856.

Ang, Kah W., "Enhanced performance in 50 nm N-MOSFETs with silicon-carbon source/drain regions", *IEEE International Electron Devices Meeting, 2004. IEDM Technical Digest.*, (Dec. 2004),1069-1071.

Auberton-Herve, A J., "SOI: Materials to Systems", *International Electron Devices Meeting, Technical Digest*, (1996),3-10.

Autumn, Kellar , et al., "Adhesive force of a single gecko foot-hair", *Nature*, 405(6787), (Jun. 2000),681-685.

Autumn, Kellar , et al., "Evidence for van der Waals adhesion in gecko setae.", *Proceedings of the National Academy of Science U S A.*; 99(19), (Sep. 17, 2002),12252-6.

Baginski, T. A., "Back-side germanium ion implantation gettering of silicon", *Journal of the Electrochemical Society*, 135(7), Dept of Electrical Engineering, Auburn Univ, AL,(Jul. 1988),1842-3.

Ball, Philip , "Why microchips weigh over a kilogram: A small mountain of material goes into every microchip", *Nature Science Update*, http://www.nature.com/nsu/021028/021028-12.html,(Nov. 2, 2002),1-2.

Belford, Rona E., et al., "Performance-Augmented CMOS Using Back-End Uniaxial Strain", *IEEE 60th DRC. Conference Digest Device Research Conference, 2002*, (Jun. 24-26, 2002),41-42.

Berti, M., "Composition and Structure of Si-Ge Layers Produced by Ion Implantation and Laser Melting", *Journal of Materials Research*, 6(10), (Oct. 1991),2120-2126.

Berti, M., "Laser Induced Epitaxial Regrowth of Si[sub 1-x]Ge[sub x]/Si Layers Produced by Ge Ion Implantation", *Applied Surface Science*, 43, (1989),158-164.

Bialas, F., et al., "Intrinsic Gettering of 300 mm CZ Wafers", *Microelectronic Engineering*, 56(1-2), (May 2001),157-63.

Biever, Celeste, "Secret of 'strained silicon' revealed: behind closed doors, Intel has perfected a novel way to improve chip performance.", *New Scientist*, 180(i2426-2428), (Dec. 20, 2003),27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena*, 82-84, (2001),387-92.

Bronner, G. B., et al., "Physical Modeling of Backside Gettering", *Impurity Diffusion and Gettering in Silicon Symposium*, Sponsor: Mater. Res. Soc, Nov. 1984, Boston, MA,(1985),27-30.

Brown, Chappell, "Bonding twist hints at universal substrate", *EETimes*, (1997),2 pages.

Bruel, M, "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997),1636-1641.

Cartagena, E, et al., "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ,(1993),191.

Chen, Xiangdong, et al., "Vertical P-MOSFETs with heterojunction between source/drain and channel", *IEEE Device Research Conference*, (2000),25-26.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989),42-44.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Clark, Don, et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96, Proceedings of the 26th European Solid State Device Research Conference*, (Sep. 1996),519-22.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin.eng.uc.edu/projects/bonding/paper.pdf,(2000),32.

Dubbelday, W B., "Oscillatory strain relaxation in solid phage epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Forbes, K Y., "Non-Volatile Memory Device with Tensile Strained Silicon Layer", U.S. Appl. No. 11/260,339 (client ref No. 05-0753—Leffert file), 26 pgs.

Fournel, F, et al., "Ultra High Precision of the Tilt/Twist Misorientation Angles in Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Ghani, T., "A 90nm High Volume Manufacturing Logic Technology Featuring Novel 45nm Gate Length Strained Silicon CMOS Transistors", *Technical Digest IEEE International Electron Devices Meeting*, (Dec. 2003),978-980.

Godbole, H., et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989),201-3.

Gong, S. S., et al., "Implantation Gettering in Silicon", *Solid-State Electronics*, 30(2), (Feb. 1987),209-11.

Goto, K., "Technology Booster using Strain-Enhancing Laminated SiN (SELS) for 65nm Node Hp MPUs", *IEDM Technical Digest. IEEE International Electron Devices Meeting*, (Dec. 2004),209-212.

Graf, D., et al., "300 mm epi pp- wafer: is there sufficient gettering?", *High Purity Silicon VI. Proceedings of the Sixth International Symposium (Electrochemical Society Proceedings vol. 2000-17) (SPIE vol. 4218)*, (2000),319-30.

Haddad, H., et al., "Carbon Doping Effects on Hot Electron Trapping", *28th Annual Proceedings. Reliability Physics 1990*, (Mar. 1990)288-9.

Haddad, H., et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Imthurn, George P., et al., "Bonding Silicon-on-Sapphire Wafers and Devices", *Journal of Applied Physics*, 72(6), (Sep. 1992),2526-7.

Iyer, S. S., "Separation by Plasma Implantation of Oxygen (SPIMOX) operational phase space", *IEEE trans. on Plasma Science*, 25, (1997),1128-1135.

Kal, S., et al., "Strained Silicon-SiGe Devices Using Germanium Implantation", *IETE Journal of Research*, 43 (2-3), (Mar. 1997),185-192.

Kalavade, Pranav, et al., "A novel sub-10 nm transistor", *58th DRC. Device Research Conference, Conference Digest*, (Jun. 19-21, 2000),71-72.

Kang, J. S., et al., "Gettering in Silicon", *Journal of Applied Physics*, 65(8), Center for Solid State Electron Res., Arizona State Univ., Tempe, AZ,(Apr. 15, 1989),2974-85.

Komoda, T., "Mobility Improvement for 45nm Node by Combination of Optimized Stress Control and Channel Orientation Design", *IEEE International Electron Devices Meeting, 2004. IEDM Technical Digest.*, (Dec. 2004),217-220.

Kostrzewa, M, et al., "Testing the Feasibility of strain relaxed InAsP and InGaAs compliant substrates", *EMC 2003 International Conference Indium Phosphide and Related Materials. Conference Proceedings*, (Jun. 2003),8.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA,(Dec. 1983),1437-41.

Lasky, J. B., "Wafer Bonding for Silicon-on-Insulator Technologies", *Applied Physics Letters*, 48(1), (Jan. 6, 1986),78-80.

Li, Y. X., et al., "New intrinsic gettering process in Czochralski-silicon wafer", *6th International Conference on Solid-State and Integrated Circuit Technology. Proceedings*, 1(1), (2001),277-9.

Loo, Y L., et al., "Contact Printing With Nanometer Resolution", *Device Research Conference*, (Jun. 2002),149-150.

Lu, D, , "Bonding Silicon Wafers by Use of Electrostatic Fields Followed by Rapid Thermal Heating", *Materials Letters*, 4(11), (Oct. 1986),461-464.

Lu, X., et al., "SiGe and SiGeC Surface Alloy Formation Using High-Dose Implantation and Solid Phase Epitaxy", *Proceedings of the 11th International Conference on Ion Implantation Technology*, Austin, TX,(1997),686-689.

Maikap, S., "Package-strain-enhanced device and circuit performance", *IEEE International Electron Devices Meeting, 2004. IEDM Technical Digest.*, (Dec., 2004),233-236.

Meyerson, B S., "SiGe-Channel Heterojunction p-MOSFET's", *IEEE Transactions on Electron Devices*, 41(1), Authors: Verdonckt-Vandebroek, S.; Crabbe, E.F.; Meyerson, B.S.; Harame, D.L.; Restle, P.J.; Stork, J.M.C.; Johnson, J.B,(Jan. 1994),90-101.

Mizuno, T, et al., "Advanced SOI-MOSFETs with Strained-Si Channel for High Speed CMOS Electron/Hole Mobility Enhancement", *2000 Symposium on VLSI Technology, Digest of Technical Papers*, (2000),210-211.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Nayak, D. K., "High performance GeSi quantum-well PMOS on SIMOX", *International Electron Devices Meeting 1992. Technical Digest*, (1992),777-780.

Nichols, F. A., et al., "Surface- (interface-) and volume-diffusion contributions to morphological charges driven by capillarity", *Transactions of the American Institute of Mining, Metallurgical and Petroleum Engineers*, 233(10), (1965),1840-8.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Omi, Hiroo , et al., "Semiconductor Surface with Strain Control", http://www.brl.ntt.co.jp/J/kouhou/katsudou/report00/E/report04_e.html, (2008).

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991),596-8.

Ouyang, Q , et al., "Bandgap Engineering in Deep Submicron Vertical pMOSFETs", *IEEE 58th DRC. Device Research Conference. Conference Digest*, (2000),27-28.

Paine, D. C., et al., "The Growth of Strained Si]-xGex Alloys on (100) Silicon Using Solid Phase Epitaxy", *Journal of Materials Research*, 5(5), (May 1990),1023-1031.

People, R. , "Calculation of critical layer thickness versus lattice mismatch for GexSi1-x/Si strained-layer heterostructures", *Applied Physics Letters*, 47(3), (Aug. 1, 1985),322-324.

Pidin, S. , "A Novel Strain Enhanced CMOS Architecture Using Selectively Deposited High Tensile and High Compressive Silicon Nitride Films", *IEEE International Electronic Devices Meeting, 2004. IEDM Technical Digest.*, (Dec. 2004),213-216.

Reinhold Published Co., "Comparisons of Materials: Coefficient of Thermal Expansion", *Reprinted with permission from "Materials Selector", Reinhold Published Co., Penton/IPC*, http://www.handyharmancanada.com/TheBrazingBook/comparis.htm, (2009).

Renlund, G. , "Silicon oxycarbide glasses: Part II. Structure and properties",*Journal of Materials Research*, 6(12), (Dec. 1991),2723-2734.

Rim, Kern , et al., "Fabrication and analysis of deep submicron strained-Si n-MOSFET's", *IEEE Transactions on Electron Devices*, 47(7), (Jul. 2000),1406-1415.

Rim, Kern , et al., "Strained Si NMOSFETs for High Performance CMOS Technology", *2001 Symposium on VLSI Technology. Digest of Technical Papers*, (2001),59-60.

Rim, Kern , et al., "Transconductance enhancement in deep submicron strained Si n-MOSFETs", *International Electron Devices Meeting 1998, Technical Digest*, (1998),707-710.

Rubin, L , et al., "Effective gettering of oxygen by high dose, high energy boron buried layers", *1998 International Conference on Ion Implantation Technology. Proceedings*, 2(2), (1998),1010-13.

Sato, Tsutomu , "A New Substrate Engineering for the Formation of Empty Space in Silicon (ESS) Induced by Silicon Surface Migration", *IEDM Digest, paper 20.6.1*, (1999),20.6.1-20.6.4.

Sato, T , "Trench transformation technology using hydrogen annealing for realizing highly reliable device structure with thin dielectric films", *1998 Symposium on VLSI Technology Digest of Technical Papers*, (1998),206-7.

Sugiyama, N , et al., "Formation of strained-silicon layer on thin relaxed-SiGe/SiO/sub 2//Si structure using SIMOX technology", *Thin Solid Films*, 369(1-2), (Jul. 2000),199-202.

Suni, T , et al., "Effects of Plasma Activation on Hydrophilic Bonding of Si and SiO2", *Journal of the Electrochemical Society*, 149, (2002),G348-51.

Takagi, Shin-Ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.

Tan, T. Y., et al., "Intrinsic Gettering by Oxide Precipitate Induced Dislocations in Czochralski Silicon", *Applied Physics Letters*, vol. 30, No. 4, (Feb. 1977),175-176.

Thompson, S. E., "Key Differences for Process-induced Uniaxial vs. Substrate-induced Biaxial Stressed Si and Ge Channel MOSFETs", *IEEE International Electron Devices Meeting, 2004. IEDM Technical Digest.*, (Dec. 2004),221-224.

Welser, J , "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", *Materials Issues in Silicon Integrated Circuit Processing Symposium*, (Apr. 1986),53-57.

Wijaranakula, W. , et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR,(Sep.-Oct. 1986),698-704.

Wijaranakula, W. , et al., "Effect of preanneal heat treatment on oxygen precipitation in epitaxial silicon", *Materials Issues in Silicon Integrated Circuit Processing Symposium*, (Apr. 1986),139-44.

Wijaranakula, W. , et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR,(Sep.-Oct. 1986),693-7.

Wild, M. , "Laser Assisted Bonding of Silicon and Glass in Micro-System Technology", http://www.ilt.fhg.de/eng/jb00-s42.html, Fraunhofer ILT—jb00-s42,(2003),1.

Xiao, Q. , et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004),2163-2166.

Xuan, Peiqi , at al., "60nm Planarized Ultra-thin Body Solid Phase Epitaxy MOSFETs", *IEEE Device Research Conference, Conference Digest. 58th DRC*, (Jun. 19-21, 2000),67-68.

Yang, D. , et al., "Intrinsic Gettering in Nitrogen Doped Czochralski Crystal Silicon", *High Purity Silicon VI. Proceedings of the Sixth International Symposium (Electrochemical Society Proceedings* vol. 2000-17) (SPIE vol. 4218). (2000),357-61.

Yang, Deren , et al., "Nitrogen in Czochralski Silicon", *2001 6th International Conference on Solid-State and Integrated Circuit Technology. Proceedings*, 1(1), (2001),255-60.

Yin, Haizhou , "High Ge-Content Relaxed Sil-xGex Layers by Relaxation on Complaint Substrate with Controlled Oxidation", *Electronic Materials Conference*, Santa Barbara, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

\* cited by examiner

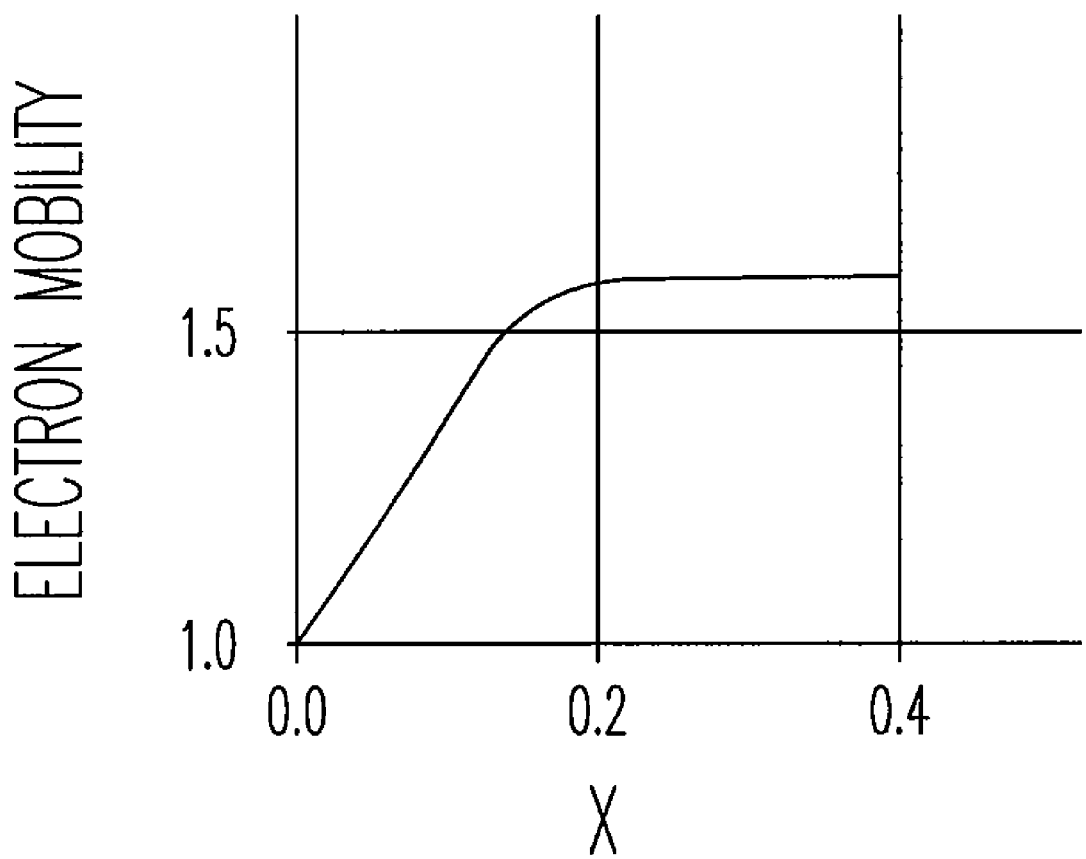
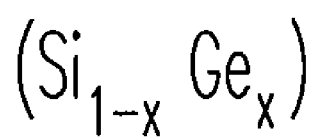
FIG. 2
(PRIOR ART)

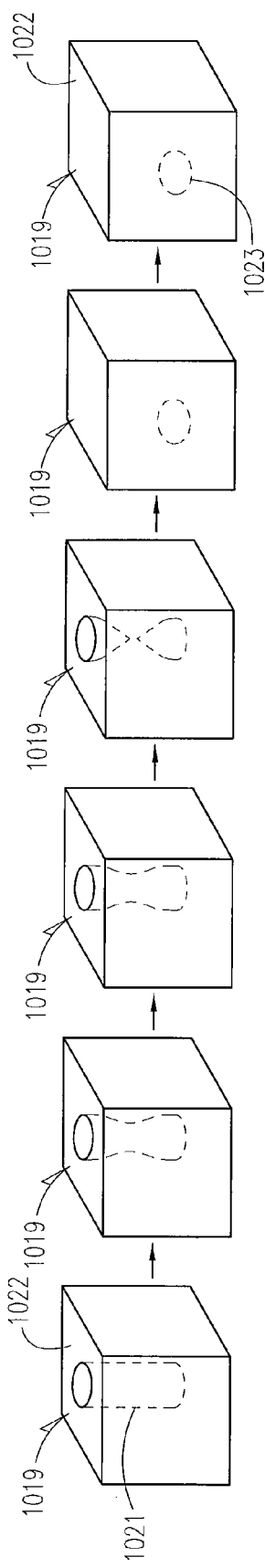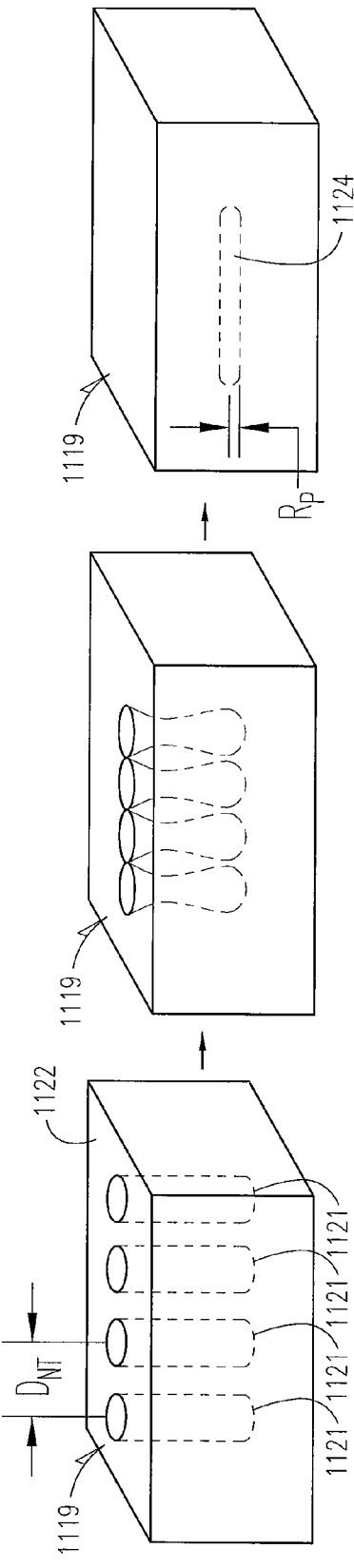

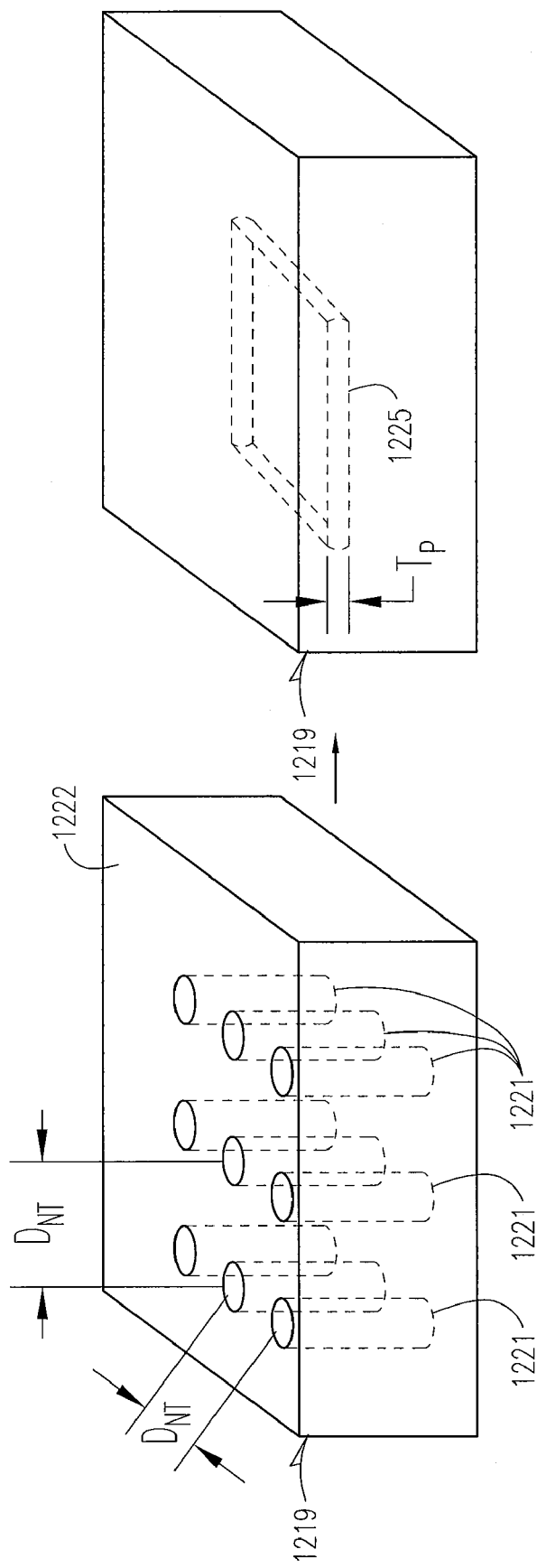

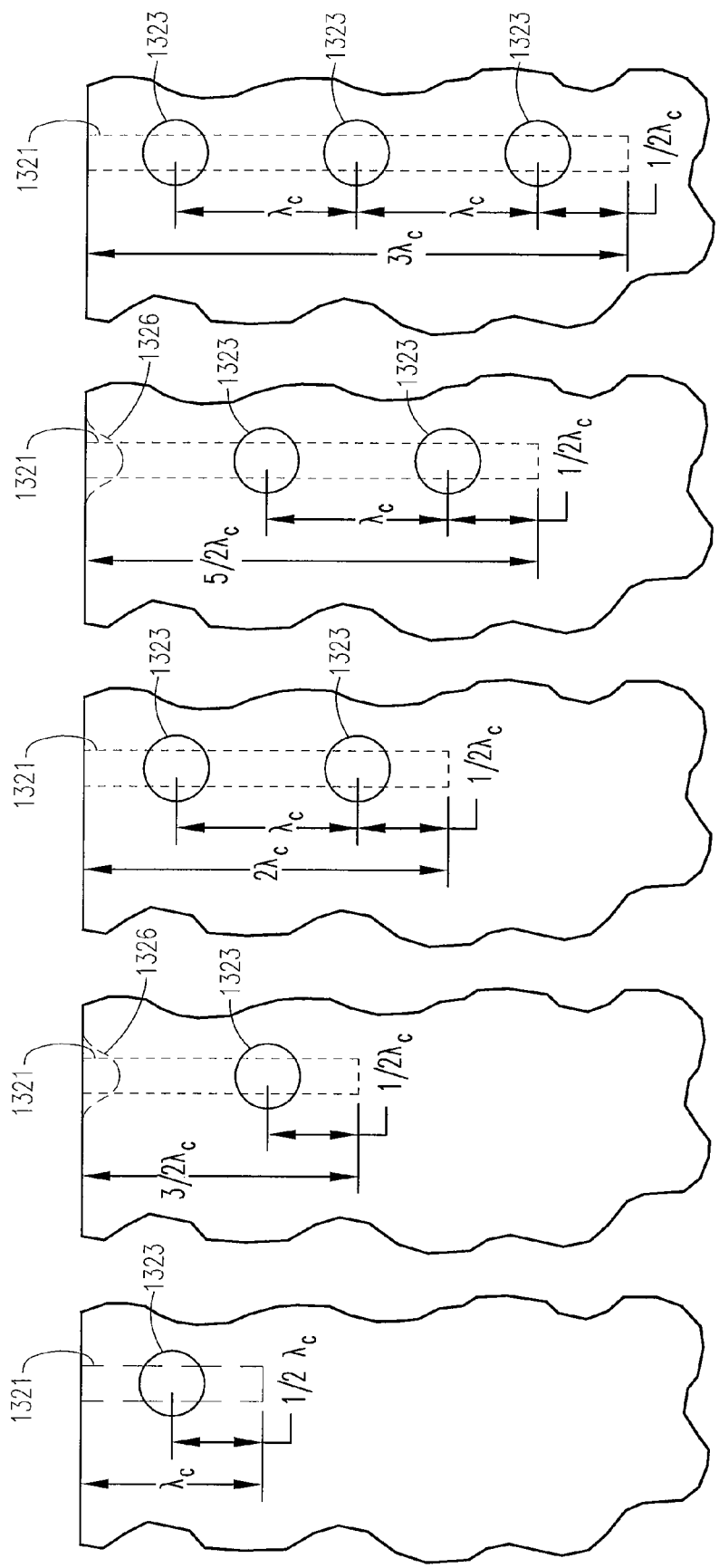

STRAINED SEMICONDUCTOR BY FULL WAFER BONDING

CROSS REFERENCE TO RELATED APPLICATIONS

This application is a Divisional of U.S. application Ser. No. 10/623,788 filed Jul. 21, 2003, now U.S. Pat. No. 7,439,158, which is incorporated herein by reference.

This application is related to the following commonly assigned U.S. patent applications which are herein incorporated by reference in their entirety: "Cellular Materials Formed Using Surface Transformation," U.S. application Ser. No. 10/382,246, filed on Mar. 5, 2003; "Micro-Mechanically Strained Semiconductor Film," U.S. application Ser. No. 10/379,749, filed on Mar. 5, 2003; "Localized Strained Semiconductor On Insulator," U.S. application Ser. No. 10/425,797, filed on Apr. 29, 2003; "Strained Si/SiGe Structures by Ion Implantation," U.S. application Ser. No. 10/431,134, filed on May 7, 2003; "Strained Semiconductor by Wafer Bonding with Misorientation," U.S. application Ser. No. 10/425,484, filed on Apr. 29, 2003; "Micromechanical Strained Semiconductor By Wafer Bonding," U.S. application Ser. No. 10/431,137, filed on May 7, 2003; and "Strained Si/SiGe/SOI Islands and Processes of Making Same," U.S. application Ser. No. 10/634,174, filed on Aug. 5, 2003.

TECHNICAL FIELD

This disclosure relates generally to integrated circuits, and more particularly, to strained semiconductor structures.

BACKGROUND

The semiconductor industry continues to strive for improvements in the speed and performance of semiconductor devices. Strained silicon technology enhances carrier mobility in both n-channel and p-channel devices, and thus improves device speed and performance.

One technique for producing strained silicon involves growing silicon on relaxed silicon germanium (Si/SiGe) structures. There is a large mismatch in the cell structure between the Si and SiGe layers. This mismatch causes a pseudomorphic layer of Si on relaxed SiGe to be under a tensile strain that modifies the band structure and enhances carrier transport in the Si layer. In an electron inversion layer, the subband splitting is larger in strained Si because of the strain-induced band splitting in addition to that provided by quantum confinement. For example, the ground level splitting ($E_0(d_4) - E_0(d_2)$) in a MOS inversion layer at 1 MV/cm transverse field is ~120 meV for unstrained Si and 250 meV for strained Si. The increase in energy splitting reduces intervalley scattering and enhances NMOSFET mobility, as demonstrated at low (<0.6 MV/cm) and higher (~1 MV/cm) vertical fields. The scaled transconductance ($g_m$) is also improved due to the reduced density of states and enhanced non-equilibrium transport.

One method for forming the Si/SiGe layer involves epitaxially growing the Si and SiGe layers using an ultra-high vacuum chemical vapor deposition (UHVCVD) process. The UHVCVD process is a costly and complex process. The Ge content is graded in steps to form a fully relaxed SiGe buffer layer before a thin (~20 nm) strained Si channel layer is grown. X-ray diffraction analysis can be used to quantify the Ge content and strain relaxation in the SiGe layer. The strain state of the Si channel layer can be confirmed by Raman spectroscopy. One proposed back end approach for straining silicon applies uniaxial strain to wafers/dies after the integrated circuit process is complete. The dies are thinned to membrane dimensions and then affixed to curved substrates to apply an in-plane, tensile strain after device manufacture.

There is a need in the art to provide improved strained semiconductor films and devices that incorporate the strained films, and to provide improved methods for forming strained semiconductor films.

BRIEF DESCRIPTION OF THE DRAWINGS

FIG. 2 illustrates the mobility enhancement for strained Si for different percentages (X) of Ge in a $Si_{1-X}Ge_X$ substrate.

FIG. 10A-10F illustrate a process to form a wafer with a sphere-shaped empty space, according to various embodiments of the present invention.

FIG. 11A-11C illustrate a process to form a wafer with a pipe-shaped empty space, according to various embodiments of the present invention.

FIGS. 12A-12B illustrate a process to form a wafer with a plate-shaped empty space, according to various embodiments of the present invention.

FIG. 13A-13E illustrate the formation of empty spheres from initial cylindrical holes in a wafer with the same radii and with varying length, according to various embodiments of the present invention.

DETAILED DESCRIPTION

Figure 1:
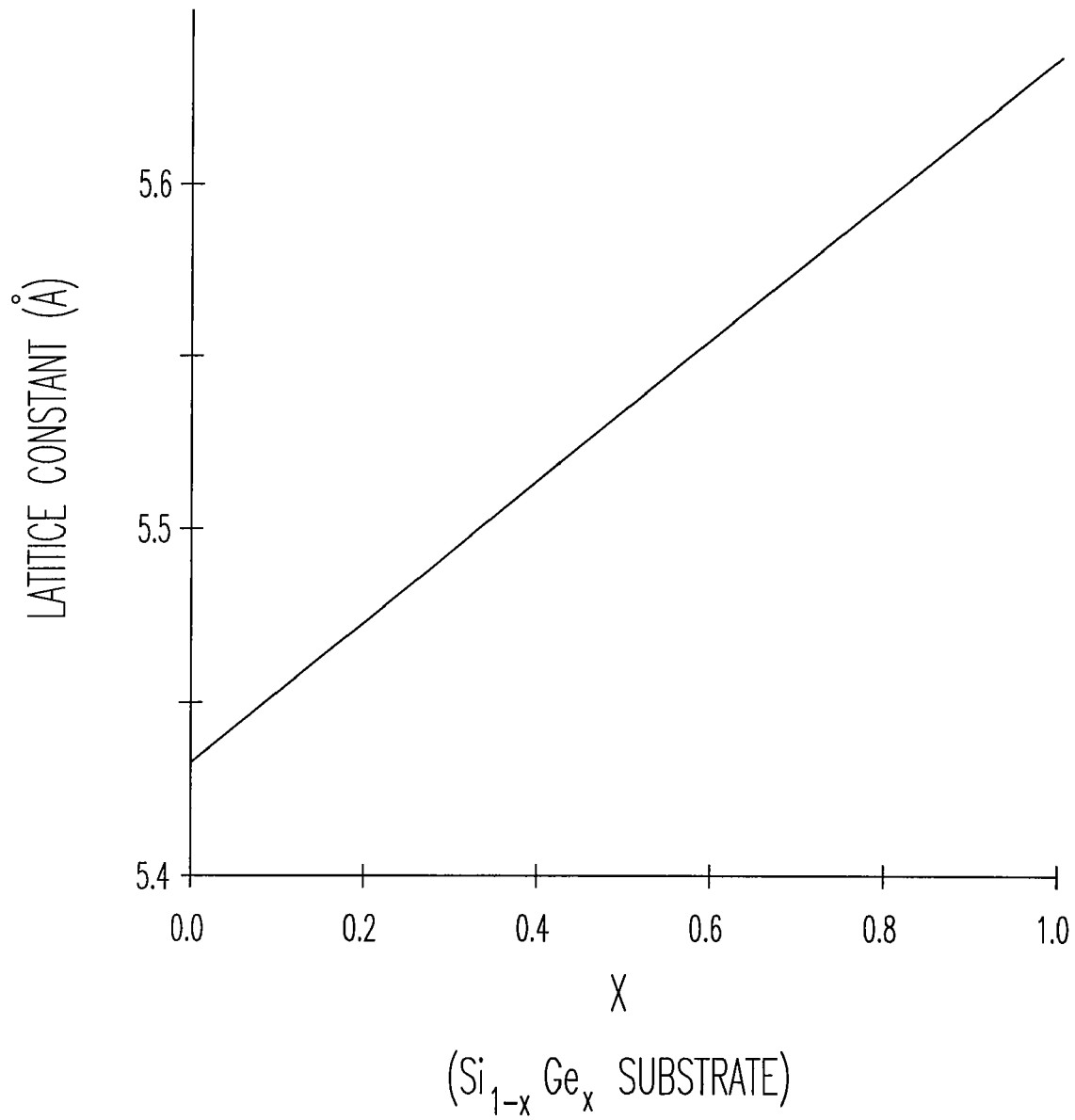
FIG. 1 illustrates the lattice constant of a $Si_{1-X}Ge_X$ substrate for different percentages (X) of Ge.

The following detailed description refers to the accompanying drawings which show, by way of illustration, specific aspects and embodiments in which the present invention may be practiced. References to "an", "one", or "various" embodiments in this disclosure are not necessarily to the same embodiment, and such references contemplate more than one embodiment. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Various aspects and embodiments of the present invention mechanically stretch a semiconductor layer during full wafer bonding to form a wafer with a strained semiconductor layer. According to various embodiments, the strained semiconductor layer is an ultra-thin silicon layer.

One aspect of this disclosure relates to a method for forming a wafer. In various embodiments of the method, a predetermined contour is formed in one of a semiconductor membrane and a substrate wafer. The semiconductor membrane is bonded to the substrate wafer and the predetermined contour is straightened to induce a predetermined strain in the semiconductor membrane. In various embodiments, a substrate wafer is flexed into a flexed position, a portion of the substrate wafer is bonded to a semiconductor layer when the substrate wafer is in the flexed position, and the substrate wafer is relaxed to induce a predetermined strain in the semiconductor layer. In various embodiments, a central region of a substrate wafer is flexed into a flexed position, a bond cut process is performed to form a silicon membrane from a crystalline sacrificial wafer and bond a peripheral region of the substrate wafer to a peripheral region of a silicon membrane when the substrate wafer is in the flexed position, and the substrate wafer is relaxed to induce a predetermined strain in the silicon membrane. Other aspects and embodiments are provided herein.

Aspects of the present invention strain a semiconductor layer, such as a crystalline silicon layer, by mechanical stretching of the semiconductor layer during full wafer bonding. In various embodiments, the semiconductor layer is an ultra-thin semiconductor layer. Various embodiments bond the ultra-thin semiconductor layer to a bowed flexible substrate during full wafer bonding. Various embodiments bond a semiconductor layer with a bowed surface to a fixed wafer during a full wafer bonding.

This detailed description is organized as follows. First, this discussion uses research findings of Si/SiGe to determine a desired mechanical strain for the semiconductor layer. Second, a brief discussion of full wafer bonding is provided. Third embodiments that bond semiconductor membranes to a bowed, flexible substrate are discussed. Various embodiments bow a thin flexible substrate, and various embodiments bow a thicker flexible substrate having voids formed by surface transformation. Fourth, this disclosure discusses bonding relaxed ultra-thin semiconductor membrane with a bowed shape to a rigid substrate. Fifth, this disclosure discusses bonding a single crystal wafer with a relaxed concave surface to a rigid substrate. Sixth, this disclosure discusses various method aspects for straining a semiconductor layer at a wafer scale. Seventh, this disclosure discusses a transistor that incorporates the strained semiconductor. Eighth, this disclosure discusses systems such as memory devices and computers. The headings and numbering used to organize the detailed description should not be used to limit the present invention, but rather are intended to assist the reader in navigating through this disclosure.

1. Desired Mechanical Strain

This disclosure discusses mechanically straining a wafer-sized semiconductor layer, i.e. straining a semiconductor layer at a wafer scale. According to embodiments provided in this disclosure, silicon is mechanically strained to enhance carrier mobility. Other semiconductor material can be strained in accordance with the subject matter discussed herein. Research findings for Si/SiGe structures can be used to determine desirable mechanical strain.

Si has a lattice constant of 5.43095 Å, and Ge has a lattice constant of 5.64613 Å. The lattice constant of SiGe is between the lattice constant of Si and the lattice constant of Ge, and depends on the percentage of Ge in the SiGe layer. FIG. 1 illustrates the lattice constant of a $Si_{1-X}Ge_X$ substrate for different percentages (X) of Ge. As indicated by FIG. 1, a $Si_{1-X}Ge_X$ substrate containing about 30% Ge (X≈0.3) has a lattice constant of about 5.50 Å. The biaxial strain of the Si on the SiGe can be calculated as follows:

$$\text{Biaxial\_Strain} = \frac{SiGe_{LC} - Si_{LC}}{Si_{LC}} \qquad (1)$$

where the subscript LC represents the lattice constant of the SiGe or Si. Thus, as shown in Equation 2, the Si on the SiGe substrate has a biaxial strain of about 1.28%.

$$\text{Biaxial\_Strain} \approx \frac{5.50 - 5.43}{5.43} = 1.28\%. \quad (2)$$

FIG. 2 illustrates the mobility enhancement for strained Si for different percentages (X) of Ge in a $Si_{1-X}Ge_X$ substrate. The mobility enhancement increases as the percentage of Ge in the $Si_{1-X}Ge_X$ increases, and levels off to around 1.6 when the percentage of Ge is around 22% or larger. Referring to FIG. 1, 22% Ge provides the $Si_{1-X}Ge_X$ substrate with a lattice constant ($SiGe_{LC}$) of around 5.485. Using Equation 1, it is determined that the corresponding strain for 22% Ge (the approximate point where the mobility enhancement levels off) is about 1%.

When the percentage of Ge in the $Si_{1-X}Ge_X$ is about 20% (near the knee of the curve), it can be calculated that the resulting strain is about 0.75%. When the percentage of Ge in the $Si_{1-X}Ge_X$ is about 40%, it can be calculated that the resulting strain is about 1.5%. Referring again to FIG. 1, it can be seen that a $Si_{1-X}Ge_X$ substrate having just under 10% Ge still provides considerable mobility enhancement (1.3). A $Si_{1-X}Ge_X$ substrate having just under 10% Ge provides the $Si_{1-X}Ge_X$ substrate with a lattice constant ($SiGe_{LC}$) of around 5.457. Using Equation 1, it is determined that the corresponding strain is around 0.5%. Thus, it is desirable to achieve a biaxial strain around or greater than 0.5%, and preferably around 1% or greater to obtain the desired enhanced mobility associated with strained Si.

Figure 3:
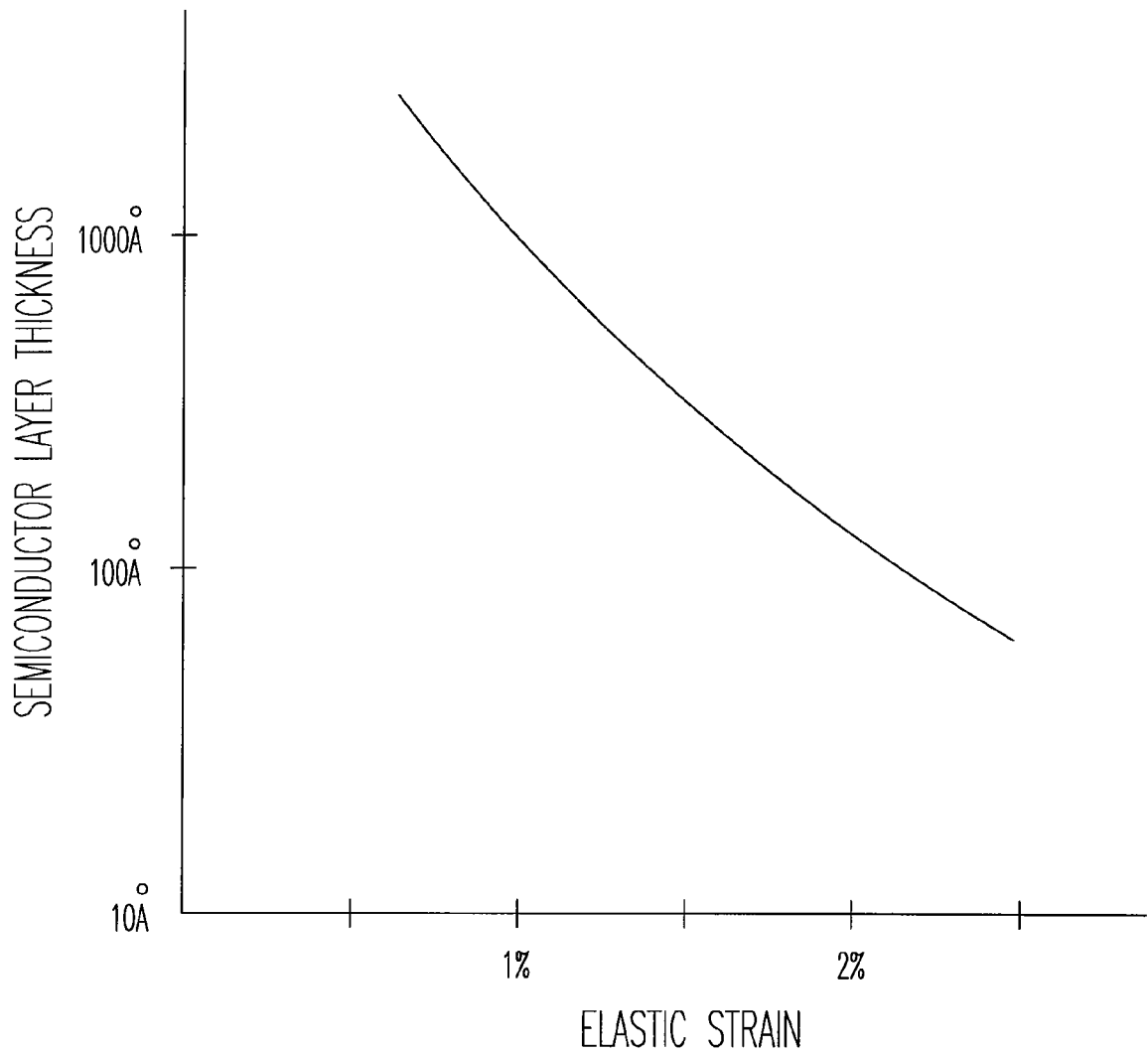
FIG. 3 illustrates a relationship between elastic strain and semiconductor layer thicknesses.

Various embodiments of the present invention mechanically induce a strain in thin semiconductor wafers. FIG. 3 illustrates a relationship between elastic strain and semiconductor layer thicknesses. The semiconductor yield is plotted with respect to plastic deformation and defects in bulk samples. The illustrated values represent the relationship of thin SiGe layers on silicon. FIG. 3 illustrates that thin layers of silicon or other semiconductor materials are more tolerant of strain than thick bulk samples. Previously, thin layers of SiGe have been fabricated on silicon because of the tolerance of the thin layers to strain. FIG. 3 indicates that 1000 Å thin semiconductor layers can be strained up to about 1%, that 100 Å thin semiconductor layers can be strained up to about 2% and thinner semiconductor layers can be strained up to about 2.5%. However, as illustrated earlier with respect to FIG. 2, the mobility enhancement levels off when the strain reaches about 1%.

It is thus desirable to strain a thin semiconductor layer, such as a silicon layer, with a strain greater than 0.5% to achieve significant mobility enhancement. For further mobility enhancement, it is desirable to strain a thin semiconductor wafer, such as an ultra-thin silicon wafer with a thickness within a range of approximately 300 Å to 1000 Å, with a strain within a range of approximately 0.75% to approximately 1.5% where the mobility enhancement levels off. It is also desirable to reduce unnecessary strain and provide a margin for error without unduly affecting the mobility enhancement. Thus, it is desirable to strain a thin semiconductor layer, such as a thin silicon layer, with a strain in the range of approximately 1% to approximately 1.2%.

Ultra-thin wafers, such as single crystalline silicon wafers, have a thickness below approximately 200 microns, which is near the limit of known mechanical thinning techniques. Virginia Semiconductor, Inc. has produced these wafers with a thickness down to about 2 microns with diameters of up to 4 inches. Doping concentrations and profiles for these wafers are comparable to normal thickness wafers, and the Total Thickness Variation (TTV) is generally less than one micron. Bond-quality, ultra-thin wafers are double side polished and have micro-roughness comparable to prime grade, normal thickness wafers. Ultra-thin wafers that have a thickness of approximately 100 microns or more are mechanically similar to normal wafers and can be processed using standard techniques. As the thickness decreases further, the wafer exhibits greater flexibility to the point, at about 20 microns thick, that the wafer can be deformed into a tube, with the wafer contacted flat with the opposite edge. At a thickness less than about 10 microns, ultra-thin wafers become transparent to visible light. The increased flexibility allows ultra-thin wafers to bond to surfaces with roughness orders of magnitude greater than the limit for bonding normal thicknesses.

Recently, a bond cut technique, referred to in literature as a Smart-Cut technique, has been described for producing silicon on insulator wafers for integrated circuits. As will be described in detail below, the bond cut technique implants ions such as hydrogen, bonds two wafer surfaces together, and separates the two bonded wafers along the region of hydrogen implantation. The literature indicates that memory structures have been inverted and stacked capacitors have been buried by wafer bonding. Various techniques such as grinding, polishing, chemical etch, chemical etch with etch stops, and/or plasma assisted chemical etch, can be used to further thin the top wafer to a thickness on the order of a micron after the wafers are bonded. Besides oxide or silicon, silicon has been bonded on other materials such as sapphire wafers.

The bond cut technique will be discussed in further detail in the section entitled "Bonding Semiconductor Membrane to Bowed Substrates." In various embodiments, the ultra-thin semiconductor film is produced by a hydrogen implantation into a sacrificial wafer leaving a single crystalline 300 Å to 1000 Å surface layer which will separate from the carrier wafer when the film is bonded face down on the device wafer. After the final high temperature bonding heat treatment, the bonded layer is polished by chemical and/or mechanical means to make the surface smoother leaving an ultra-thin strained film on the order of 300 Å to 1000 Å thick.

2. Full Wafer Bonding

Figure 4A:
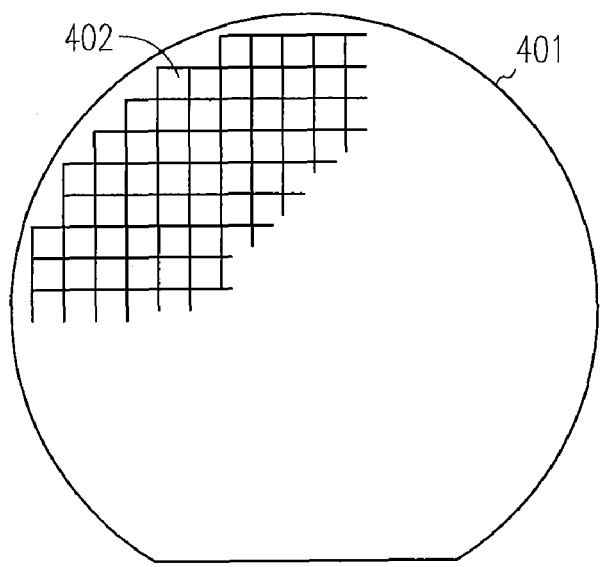
FIGS. 4A-4B illustrate a wafer and a full wafer bonding process, respectively.
Figure 4B:
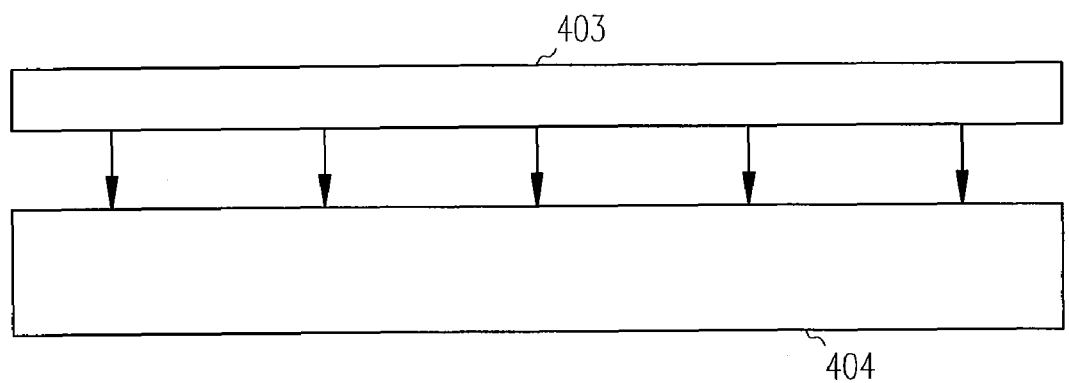

FIGS. 4A-4B illustrate a wafer and a full wafer bonding process, respectively. Various techniques to produce strained semiconductor involve a full wafer bonding technique. Various embodiments produce strained silicon layers on silicon, glass, quartz, silicon oxycarbide and other glass substrates.

FIG. 4A illustrates a wafer 401. A common wafer size is 8 inches in diameter. However, wafers are capable of being fabricated in other sizes. The present invention is not limited to wafers of a particular size. A number of dies can be formed on a wafer. A die 402 is an individual pattern, typically rectangular, on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for unilateral or bilateral communication and control.

FIG. 4B generally illustrates full wafer bonding process. A wafer-sized membrane 403 is bonded to a wafer substrate 404 such that the substrate wafer, or at least as portion of the substrate wafer, is covered by the membrane. The wafer-sized membrane need not be exactly the same size as the wafer. The term "wafer-sized" reflects that the bonding of the membrane to the wafer occurs on a wafer scale. The wafer substrate 404 generally corresponds to the wafer 401 illustrated in FIG. 4A without dies. The circuitry is formed in the bonded membrane after the full wafer bonding process. Various techniques and mechanisms can be used to perform a full wafer bonding process.

3. Bonding Semiconductor Membrane to Bowed Substrates

FIGS. 5A-5D illustrate a process for straining a semiconductor layer by performing a bond-cut process to bond the semiconductor layer to a flexed bow-shaped substrate, according to various embodiments of the present invention. The bond cut process involves bonding together two substrates, or wafers, and breaking off a section (i.e. the membrane) of at least one of the two substrate after the substrates have been bonded together. The substrate is also referred to herein in various embodiments as a flexible wafer or substrate wafer. The membrane is broken off of a second wafer or sacrificial wafer.

Figure 5A:
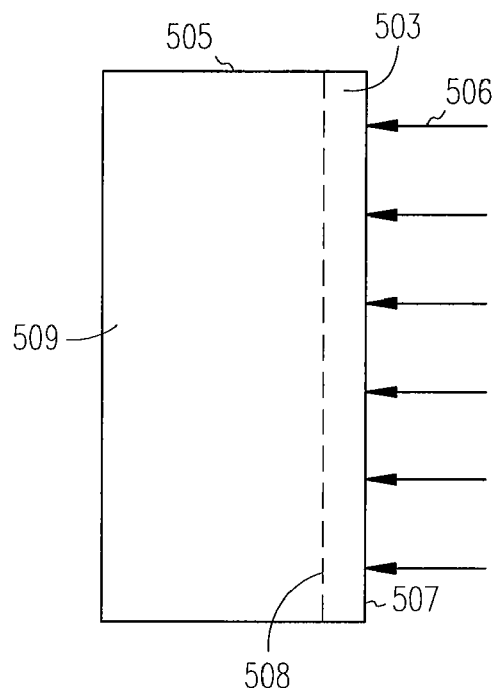
FIGS. 5A-5D illustrate a process for straining a semiconductor layer by performing a bond-cut process to bond the semiconductor layer to a flexed bow-shaped substrate, according to various embodiments of the present invention.
Figure 5B:
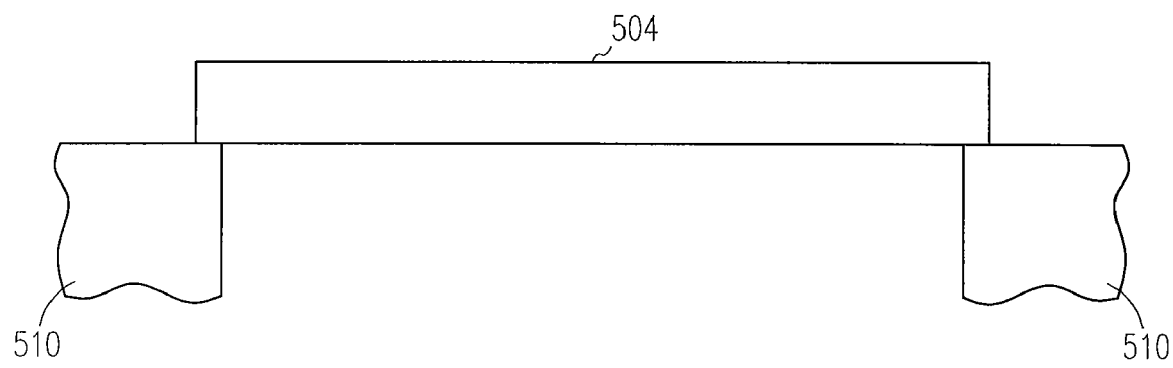

FIG. 5A illustrates a sacrificial semiconductor wafer 505, and FIG. 5B illustrates a substrate wafer 504. In various embodiments, the substrate wafer 504 includes one of the following materials: silicon; germanium; silicon-germanium; gallium arsenide; indium phosphide; and other semiconductor materials. In various embodiments, the substrate wafer 504 includes glass, quartz, silicon oxycarbide, and other glass substrates. This list of materials is not intended to be an all-inclusive list. In various embodiments, the sacrificial wafer includes various semiconductor material including but not limited to silicon, germanium, silicon-germanium, gallium arsenide, indium phosphide. The sacrificial wafer 505 can include other semiconductor materials.

Figure 5C:
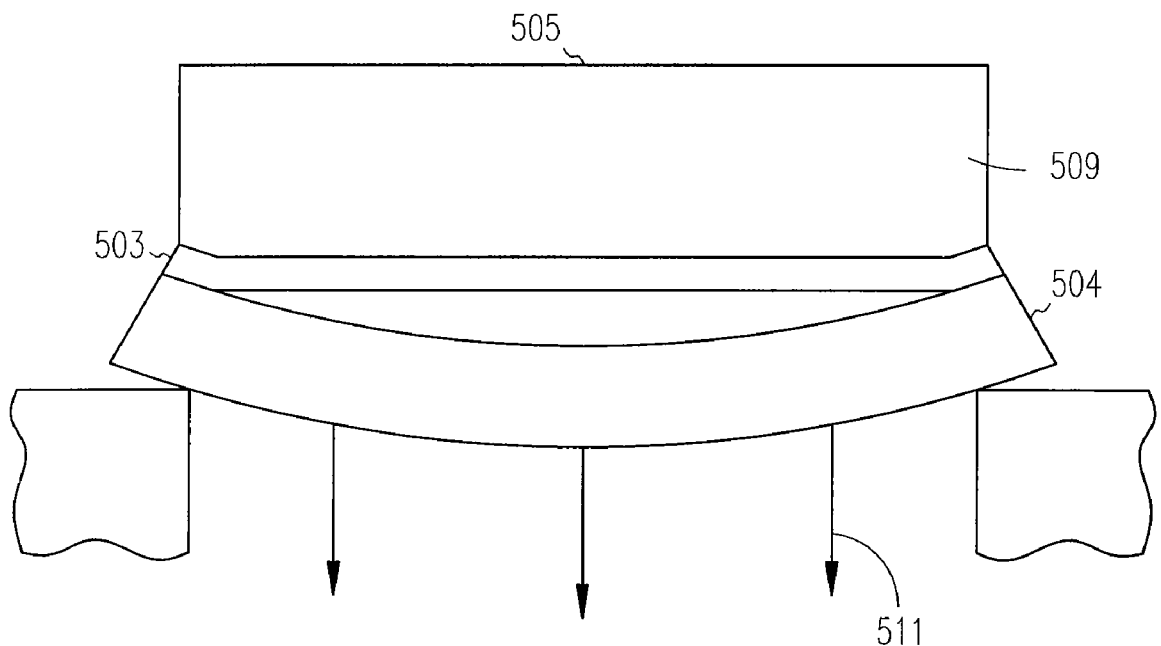

The sacrificial wafer 505 is a single crystal wafer. The bond-cut technique conditions the sacrificial wafer 505 by implanting ions 506 into a surface 507. The ions are implanted along a plane, represented in FIG. 5A as a dotted line 508, to define a semiconductor membrane 503 with a predetermined thickness. The plane 508 is approximately parallel to the surface 507 in which the ions 506 are implanted. In various embodiments, hydrogen ions are used as implantation ions. In various embodiments, the hydrogen ions include $H^+$, $H_2^+$, $D^+$, and/or $D_2^+$ ions. The implanted ions act to form cavities along the plane 508. The cavities are joined through thermal processing, allowing the membrane 503 to be removed from the remaining portion of the sacrificial wafer 509 at the cleavage plane 508. In various embodiments, this thermal processing occurs while the membrane 503 is being bonded to the substrate wafer 504, as shown in FIG. 5C. Once these cavities join and the surface layer is bonded to the substrate, the surface layer breaks off of the sacrificial wafer at the cleavage plane and remains bonded to the substrate. The remaining portion of the sacrificial wafer 505 can be used to form membranes for other substrates, thus reducing waste and the overall cost for the manufacturing process for a wide variety of electronic devices.

In the illustrated embodiment, the periphery of the substrate wafer 504 is supported by a vacuum chuck 510. The substrate wafer 504 is flexible and is capable of being influenced into a flexed position. In the illustrated embodiment, a vacuum or near vacuum, represented by arrows 511, draws the substrate wafer 504 into the chuck 510.

FIG. 5C illustrates the surface layer 507 of the sacrificial wafer 505 bonded to portions of the substrate wafer 504. In various embodiments, the periphery of the membrane 503 is bonded to the periphery of the substrate wafer 504. The periphery of the membrane and the periphery of the flexible substrate wafer are initially bonded together when the flexible substrate wafer is bowed. In the illustrated embodiment, the membrane 503 is bonded in a vacuum environment to the edge portions of the bowed substrate wafer 504. This vacuum, or near vacuum, draws the flexible substrate wafer into a contour shape (e.g. a bow). In various embodiments, this bonding is accomplished at a low temperatures in the order of 300° C. to 400° C.

In various embodiments, the bonded wafers are heated to further bond the membrane 503 to the substrate wafer 504 and to cut the membrane 503 from the sacrificial wafer 505. In various embodiments, the bonding temperature is within a range of approximately 300° C. to 400° C. Heating the sacrificial wafer joins the cavities in the cleavage plane 508, allowing the remaining portion 509 of the sacrificial wafer to be removed from the membrane 503, which remains bonded to the substrate wafer 504. The remaining portion 509 of the sacrificial wafer 505 can be prepared and conditioned for another bond-cut process.

Figure 5D:
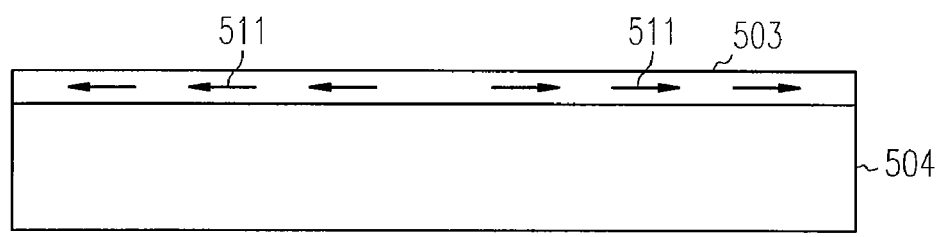

In FIG. 5D, the substrate wafer 504 is subjected to atmospheric pressure, and is removed from the vacuum chuck, which causes the flexible substrate wafer 504 to straighten (i.e. relax from its bow shape to a straight or relatively straight shape). The substrate wafer 504 induces a strain (represented by arrows 511) in the membrane 503 when the bowed contour is removed from the substrate, i.e. when the substrate wafer 504 relaxes from a flexed (bowed) position. A final wafer bonding is completed at a higher temperature in the order of 800° C. to 100° C. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing.

The thickness of the membrane 503 bonded to the substrate wafer 504 is defined by the depth of ion implantation during the bond-cut process. In various embodiments, the thickness of the membrane 503 is such that it does not yield or otherwise plastically deform under the desired mechanical strain induced by the bond. In various embodiments, the thickness of the membrane 503 is less than 200 nm, and as such is termed an ultra thin wafer. In various embodiments, the silicon layer has a thickness of about 0.1 microns (100 nm or 1000 Å). In various embodiments, the silicon layer has a thickness less than 0.1 microns. In various embodiments, the silicon layer has a thickness in a range of approximately 300 Å to 1000 Å.

In various embodiments, the silicon film is prepared for transistor fabrication. A transistor structure is discussed with respect to FIG. 23. In various embodiments, the preparation of the film includes grinding, polishing, chemical etch, chemical etch with etch stops, and/or plasma assisted chemical etch, and the like, which can be used to further thin the film. Thus, the membrane bonded to the substrate illustrated in FIG. 5D can be thinner than the surface layer defined in the sacrificial layer in FIG. 5A. Device processing can be accomplished using conventional processes and procedures.

Figure 6A:
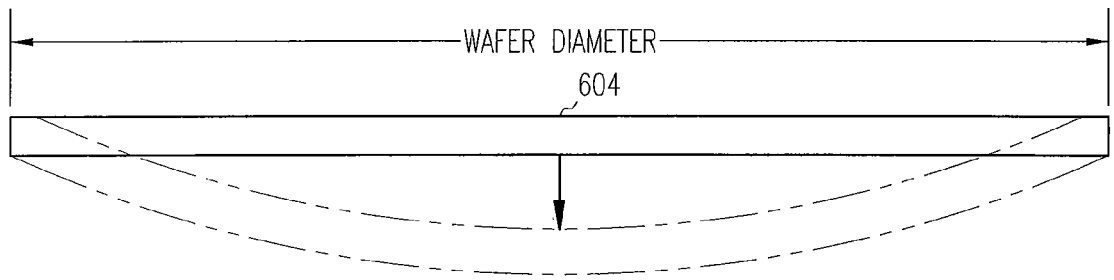
FIGS. 6A-6B illustrate relaxed and flexed wafer positions, and a strain for a wafer in the flexed position.
Figure 6B:
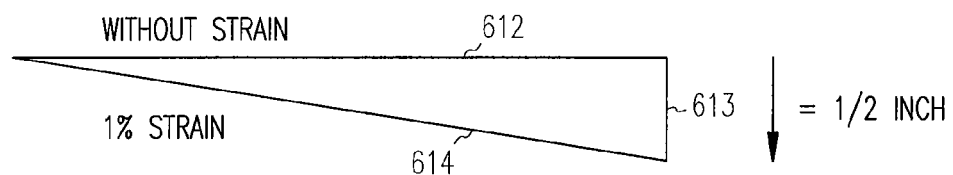

FIGS. 6A-6B illustrate relaxed and flexed wafer positions, and a strain for the wafer in the flexed position. In FIG. 6A, the solid line represents a profile of the wafer substrate 604 in a straight or relaxed state, and the dotted line represents a profiled of the wafer substrate influenced or flexed into a flexed state. A strain is induced in the wafer substrate when influenced into the flexed state.

FIG. 6B illustrates the strain in the bowed substrate. The illustrated wafer substrate 604 is bowed prior to bonding parts of the membrane to the substrate (e.g. bonding the periphery of the membrane to the periphery of the substrate). In various embodiments, the semiconductor membrane is an ultra-thin single crystalline silicon layer. In various embodiments, the semiconductor layer has a thickness within a range of approximately 300 Å to 1000 Å. In various embodiments, the semiconductor layer has a thickness (T) of about 300 Å (30 nm) suitable for use to form a transistor channel less than or equal to about 1000 Å (100 nm). The process according to various embodiments of the present invention can be geometrically represented using a triangle with a first leg 612 representing half the diameter of the wafer, and a second leg 613 representing the depth of the bow. The hypotenuse 614 of the triangle represents the strain in the bowed substrate. The strain of the substrate is transferred to the membrane when the bowed substrate is relaxed. As is shown with respect to this figure, a 1% strain can be achieved by bowing an 8 inch diameter substrate by about one half inch. An 8 inch wafer has a radius of 4 inches (or approximately 100 mm), which is represented in a relaxed state as the horizontal leg 612 of the triangle. Straining the wafer substrate by 1% increases the length from 100 mm to 101 mm, which is represented by the hypotenuse 614 of the triangle. The vertical leg 613 of the triangle represents a distance traveled when a substrate wafer is bowed into a flexed position. This distance can be determined using the following equations.

$$(100^2) + d^2 = (101^2); \quad (3)$$
$$d^2 = 201;$$
$$d \approx 14 \text{ mm} \approx 560 \text{ mils} \approx \frac{1}{2} \text{ inch.}$$

As stated earlier with respect to Si/SiGe layers, it is desired to provide silicon with a strain around or greater than 0.5% to obtain the desired enhanced mobility associated with strained silicon. Thus, as shown by the example illustrated in FIGS. 5A-5D, various embodiments of the present invention are capable of providing strains in this range. One of ordinary skill in the art will understand, upon reading and comprehending this disclosure, how to bow the substrate, bond a membrane to the bowed substrate, and relax the substrate to provide the membrane with a desired strain. In various embodiments, the substrate is bowed to an extent such that, after bonding the semiconductor membrane and the relaxing the bow in the substrate, the substrate induces a strain in the semiconductor membrane greater than 0.5%. In various embodiments, the substrate is bowed to an extent such that, after bonding the semiconductor membrane and the relaxing the bow in the substrate, the substrate induces a strain in the semiconductor membrane between approximately 0.75% to approximately 1.5%. In various embodiments, the substrate is bowed to an extent such that, after bonding the semiconductor membrane and the relaxing the bow in the substrate, the substrate induces a strain in the semiconductor membrane between approximately 1% to approximately 1.2%.

Figure 7A:
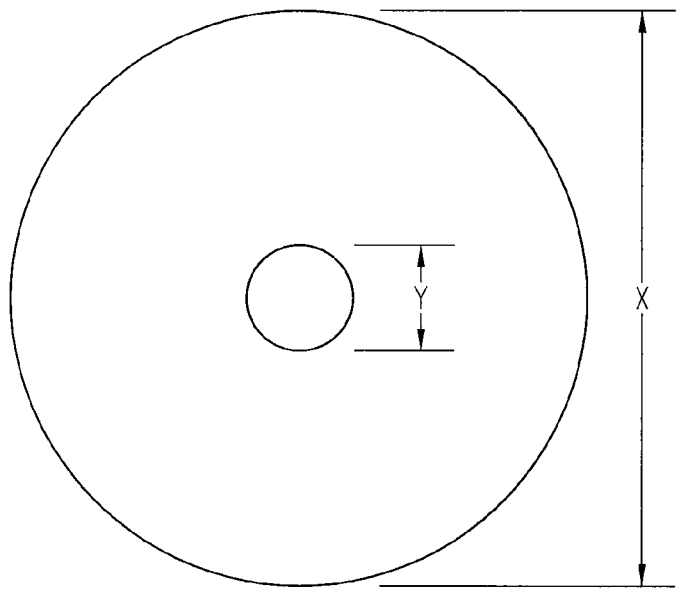
FIGS. 7A-7B illustrate a stress calculation for a bowed substrate wafer.
Figure 7B:
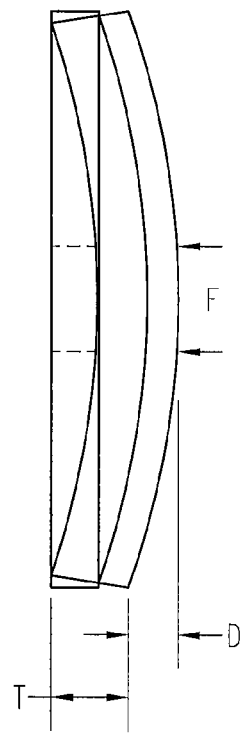

FIGS. 7A-7B illustrate a stress calculation for a bowed substrate wafer. The mechanical force, $F_m$, required to mechanically cause a deflection (D) is:

$$F_m = \frac{4Et^3 D}{x^2 - y^2}, \quad (4)$$

where E is Youngs modulus in N/mm$^2$, t is the thickness of the wafer in mm, D is the deflection in mm, and x and y are dimensions represented in the figure. The maximum bending stress ($\sigma_{max}$) in N/mm$^2$ is:

$$\sigma_{max} = \frac{3F}{2t^2}, \quad (5)$$

where F is the mechanical force.

The literature shows that a 100 μm (approximately 4 mil or 4/1000 inch) silicon substrate is very flexible and will easily bow. A glass substrate has similar characteristics. Flexible substrates are typically thin. However, thicker substrates are desirable for some applications. Two approaches with respect to the competing demands of a thicker substrate and a flexible substrate are provided below. In one approach, a semiconductor membrane is bonded to a thin flexible substrate such as illustrated in FIGS. 5A-5D, and the resulting composite structure is bonded to a thicker carrier substrate. In the second approach, a semiconductor membrane is bonded to a thicker substrate that includes voids to provide the thicker substrate with flexibility.

Figure 8:
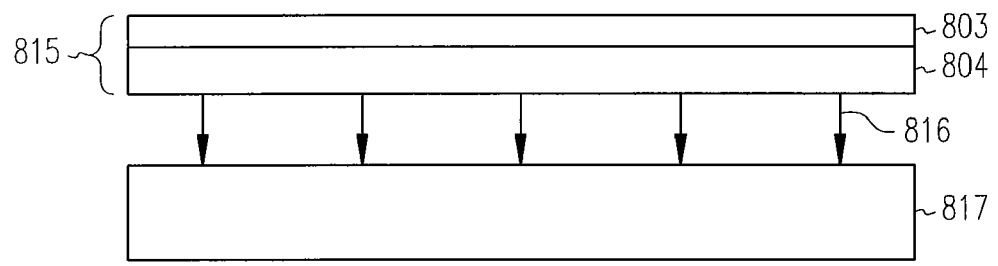
FIG. 8 illustrates a composite structure that includes a strained semiconductor membrane bonded to a flexible substrate, and further illustrates the composite structure being bonded to a thicker carrier substrate, according to various embodiments of the present invention.

Bonding to Thin Flexible Substrate, and Bonding Composite to Thicker Carrier Substrate FIG. 8 illustrates a composite structure that includes a strained semiconductor membrane bonded to a flexible substrate, and further illustrates the composite structure being bonded to a thicker carrier substrate, according to various embodiments of the present invention. In the illustration, the composite structure 815 includes a strained semiconductor membrane 803 and a flexible substrate wafer 804, which in various embodiments is fabricated according the process illustrated and discussed with respect to FIGS. 5A-5D. The composite structure 815 is bonded (represented by arrows 816) to a thicker carrier substrate 817. In various embodiments, the thicker carrier substrate 817 includes glass, quartz, a silicon oxycarbide glass, aluminum oxycarbide glass, or silicon.

Bonding Directly to Flexible Substrate Formed with Surface Transformed Voids

Figure 9A:
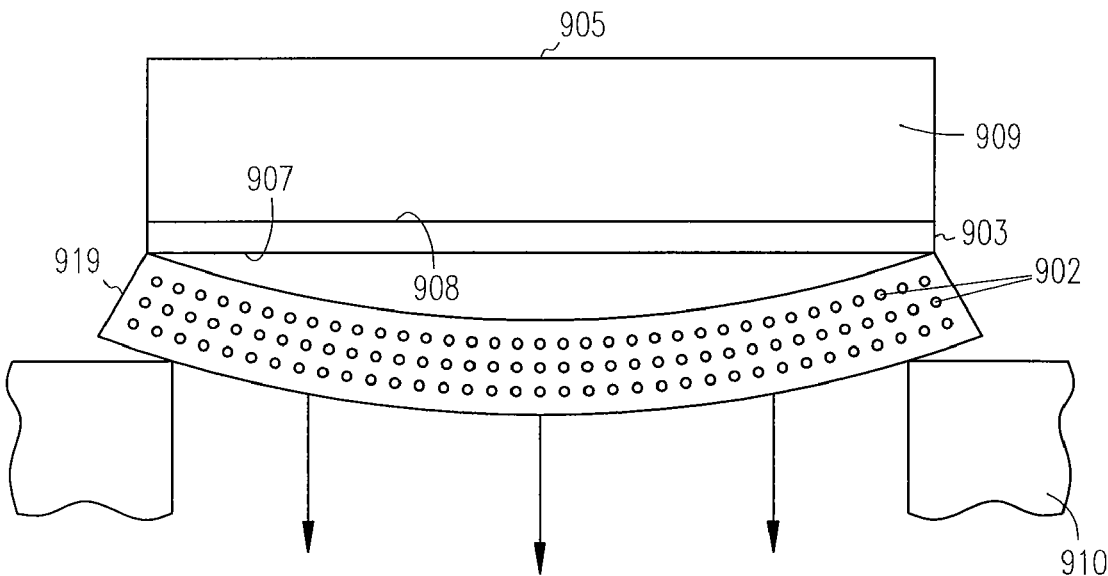
FIGS. 9A-9B illustrate a process for straining a semiconductor layer by performing a bond-cut process to a bowed substrate with voids, according to various embodiments of the present invention.
Figure 9B:
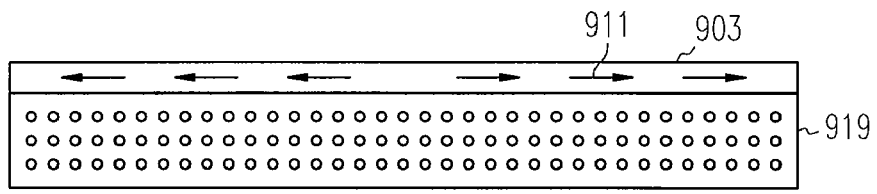

FIGS. 9A-9B illustrate a process for straining a semiconductor layer by performing a bond-cut process to a bowed substrate with voids, according to various embodiments of the present invention. The voids, such as nano-voids, modifies Young's modulus for the thicker substrate, and cause the thicker substrate wafer to be flexible. Voids in silicon or glass can be realized by a surface transformation process, where holes are etched into the material and then the material is annealed below its melting temperature. Surface transformation is discussed in "Cellular Materials Formed Using Surface Transformation," U.S. application Ser. No. 10/382,246, filed on Mar. 5, 2003, which has previously been incorporated by reference. Using the surface transformation technique, the voids can be precisely formed with a desired shape and size in a desired position. Various embodiments incorporate voids into various substrate types, including but not limited to glass and silicon substrates. Materials with voids can be referred to as cellular material.

FIG. 9A illustrates a bond-cut technique performed to bond a membrane 903, such as an ultra-thin silicon layer, to a flexible substrate 919 with voids 920. FIG. 9A also illustrates the surface layer 907 of the sacrificial wafer 905 bonded to portions of the substrate wafer 919. In various embodiments, the periphery of the membrane 903 is bonded to the periphery of the substrate wafer 919. The periphery of the membrane and the periphery of the flexible substrate wafer are initially bonded together when the flexible substrate wafer 919 is bowed. In the illustrated embodiment, the membrane 903 is bonded in a vacuum environment to the edge portions of the bowed substrate wafer 919. This vacuum, or near vacuum, draws the flexible substrate wafer into a contour shape (e.g. a bow). In various embodiments, this bonding is accomplished at a low temperatures in the order of 300° C. to 400° C.

The bonded wafers can be heated to further bond the membrane 903 to the substrate wafer 919 and to cut the membrane 903 from the sacrificial wafer 905. In various embodiments, the bonding temperature is within a range of approximately 300° C. to 400° C. Heating the sacrificial wafer joins the cavities in the cleavage plane 908, allowing the remaining portion 909 of the sacrificial wafer to be removed from the membrane 903, which remains bonded to the substrate wafer 919. The remaining portion 909 of the sacrificial wafer 905 can be prepared and conditioned for another bond-cut process.

With reference to FIG. 9B, the substrate wafer 919 is subjected to atmospheric pressure, and is removed from the vacuum chuck 910, which causes the flexible substrate wafer 919 to straighten (i.e. relax from its bow shape to a straight or relatively straight shape). The substrate wafer 919 induces a strain (represented by arrows 911) in the membrane 903 when the bowed contour is removed from the substrate, i.e. when the substrate wafer 919 relaxes from a flexed (bowed) position. A final wafer bonding is completed at a higher temperature in the order of 800° C. to 1000° C. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing.

Cellular materials provide interesting combinations of physical and mechanical properties. The substrate is referred to in this discussion as a flat panel.

The relationship between the stiffness (S) of a flat panel, the Young's modulus (E) of the panel material (representing the ability of the panel material to resist elastic strain), and the thickness (h) of the panel can be represented by:

$$S \propto E \times h^3. \tag{6}$$

Cellular material that has imperfections such as the lack of uniformity and closure of the voids can be characterized by the following experimentally-found exponential relationship between the Young's modulus (E) and density ($\rho$).

$$E \propto \rho^2. \tag{7}$$

Substituting Equation No. 7 for E in Equation No. 6 results in Equation No. 8.

$$S \propto \rho^2 \times h^3. \tag{8}$$

The following observations can be made for panels constructed of imperfect cellular material (i.e. material with non-uniform voids and/or lack of closure of voids). For a panel of a given footprint area and height, constructing the panel using imperfect cellular material half as dense ($\rho/2$) results in a panel that one fourth as stiff (S/4). Thus, imperfect cellular material provides certain benefits related to flexibility.

A perfect cellular material with uniform and closed voids is expected to provide a linear relationship between the Young's modulus (E) and the density ($\rho$), as represented by Equation No. 9.

$$E \propto \rho. \tag{9}$$

Substituting Equation No. 9 for E in Equation No. 6 results in Equation No. 10.

$$S \propto \rho \times h^3. \tag{10}$$

The following observation can be made for panels constructed of material that approaches a perfect or ideal cellular material (material with uniform voids and closure of voids). For a panel of a given footprint area and height, constructing the panel using perfect cellular material half as dense ($\rho/2$) is expected to result in a panel that is half as stiff (S/2).

Various embodiments provide a flexible material with a precisely-determined arrangement of voids (also referred to herein as empty spaces) using a surface transformation process. The substrate in which the voids are formed has a well-defined melting temperature. The substrate is annealed in a temperature range below and near the melting temperature to transform a predetermined arrangement of holes through a surface of the substrate into the desired predetermined arrangement of voids. The substrate is capable of being engineered for various structural and mechanical applications.

The uniformity, density, and space symmetry of the substrate is precisely determined by controlling the diameter, depth and position of an initial arrangement of cylindrical holes formed through a surface of a solid. In various embodiments, the holes have a generally-elongated shape extending into the volume away from the surface. In various embodiments, the holes have a generally cylindrical shape. The present subject matter is not so limited, however. In various embodiments, the precisely-controlled position of the voids is designed to provide a perfect cellular material, an imperfect cellular material, or somewhere between a perfect and imperfect cellular material such that the stiffness is between that provided in Equations 8 and 10. In various embodiments, the precisely-determined arrangement of voids provides the cellular material with an anisotropic stiffness.

When a solid is heated to a higher temperature, a solid with a hole that is beyond a critical length ($\lambda_c$) becomes unstable. For the purposes of the analysis provided below and to simplify the disclosure, the holes are referred to as cylindrical holes. However, various embodiments perform a surface transformation process using holes that are not geometrically cylindrical.

The cylindrical hole is transformed into one or more empty spheres formed along the cylinder axis. The number (N) of spheres formed depends on the length (L) and radius ($R_C$) of the cylinder. Two models of diffusion are the surface diffusion model and the pure volume diffusion model. With respect to the surface diffusion model, for example, the relation between the cylinder length (L), cylinder radius ($R_C$), and number of spheres (N) is expressed by the following equation:

$$8.89 \times R_C \times N \leq L < 8.89 \times R_C \times (N+1). \tag{11}$$

Equation 11 predicts that no empty spheres will form if $L < 8.89 \times R_C$. Each empty sphere that forms has a radius ($R_S$) expressed by the following equation:

$$R_S = 1.88 \times R_C. \tag{12}$$

If the cylinder has sufficient length L to form two spheres, the center-to-center spacing between the spheres corresponds to the critical length ($\lambda_C$) and is provided by the equation:

$$\lambda_C = 8.89 \times R_C. \tag{13}$$

The pure volume diffusion model provides similar results, with slightly different constants. For example, depending on the exact magnitude of the diffusion parameters, $\lambda_C$ can vary from $9.02 \times R_C$ to $12.96 \times R_C$. The diffusion model is capable of being determined by experiment. The remainder of this disclosure uses the surface diffusion model. One of ordinary skill in the art will understand, upon reading and comprehending this disclosure, how to apply this disclosure to another diffusion model.

Various shaped empty spaces or voids such as sphere-shaped voids, pipe-shaped voids, and plate-shaped voids are capable of being formed under the surface of a substrate with a well-defined melting temperature. The shape of the empty spaces formed during the annealing conditions depends on the size, number and spacing of the cylindrical holes that are initially formed at a lower temperature.

Various predetermined arrangements of empty spaces or voids are capable of being formed under the surface of a substrate with a well-defined melting temperature. For example, an appropriately-sized deep trench in a material with a well-defined melting temperature is transformed into empty spheres along the axis of the original trench at an annealing temperature within a predetermined a range below the melting temperature. The empty spheres are uniformly sized and spaced. Other predetermined arrangements are provided below.

FIGS. 10A-10F illustrate a process to form a wafer with a sphere-shaped empty space, according to various embodiments of the present subject matter. A cylindrical hole 1021 is formed through the surface 1022 of a substrate 1019. As used here, the term hole refers to a void that extends from a surface of the volume into the solid material and that is defined by the solid material. The material is heated (annealed) and undergoes the transformation illustrated in FIGS. 10B through 10F. The desired annealing temperature is dependent on the well-defined melting temperature of the substrate. The result of the surface transformation process is an empty sphere formed below the surface 112 of the substrate.

In order to form a single sphere, which holds true for forming a single pipe (FIGS. 11A-11C) or plate (FIGS. 12A-12B), the length (L) and radius ($R_C$) of the cylindrical holes are chosen such that Equation No. 11 with N=1 is satisfied. A vertical stacking of N empty spaces results if the length of the cylindrical holes is such that Equation No. 11 is satisfied.

In order for single surface-transformed spheres to combine with other surface-transformed spheres, the center-to-center spacing ($D_{NT}$) between the initial cylindrical holes will satisfy the following equation:

$$2 \times R_C < D_{NT} < 3.76 \times R_C. \tag{14}$$

Satisfying this equation prevents the adjacent initial cylindrical holes from touching, yet allows the adjacent surface-transformed spheres to combine and form pipe and plate empty spaces, as shown in FIGS. 11A-11C and FIGS. 12A-12B and described below.

FIGS. 11A-11C illustrate a process to form a wafer with a pipe-shaped empty space, according to various embodiments of the present subject matter. A linear array of cylindrical holes 1121 is formed in a surface 1122 of a solid substrate 1119. The cylindrical holes 1121 have a center-to-center spacing ($D_{NT}$) as calculated using Equation No. 14. The substrate 1119 is heated (annealed) and undergoes the transformation illustrated in FIGS. 11B through 11C. The result of the surface transformation process is an empty pipe-shaped void 1124 formed below the surface 1122 of the substrate 1119. The radius ($R_P$) of the pipe 1124 is provided by the following equation:

$$R_P = \sqrt{\frac{8.86 \times R_C^3}{D_{NT}}}. \tag{15}$$

FIGS. 12A-12B illustrate a process to form a cellular substrate with a plate-shaped empty space, according to various embodiments of the present subject matter. A two-dimensional array of cylindrical holes 1221 is formed in a surface 1222 of a solid substrate 1219. The cylindrical holes 1221 have a center-to-center spacing ($D_{NT}$) as calculated using Equation No. 14. The material is heated (annealed) and undergoes the transformation illustrated in FIG. 12B. The result of the surface transformation process is an empty plate-shaped void 1225 formed below the surface 1222 of the substrate 1219. The thickness ($T_P$) of a plate 1225 is given by the following equation:

$$T_P = \frac{27.83 \times R_C^3}{D_{NT}^2}. \tag{16}$$

Various embodiments disclosed herein form a flexible cellular substrate using surface transformation. In various embodiments, the present subject matter forms a precisely-determined arrangement of voids using surface transformation to provide a cellular material with a relationship between stiffness (S) and density ($\rho$) approaching that of a perfect cellular material ($S \propto \rho \times h^3$). In various embodiments, a precisely-determined arrangement of voids is formed using to provide a substrate with a desired anisotropic stiffness.

The size, shape and spacing of empty spaces is controlled by the diameter, depth and spacing of holes (or trenches) initially formed in a substrate that has a defined melting temperature. Empty spaces or voids are formed after annealing the material in a temperature range below and near the defined melting temperature. The empty spaces or voids are capable of being formed with a spherical shape, a pipe shape, plate shape, various combinations of these shape types, and/or various dimensions for the various shape type and combinations of shape type.

The volume of air incorporated in the surface transformed empty spaces is equal to the volume of air within the initial starting pattern of cylindrical holes. Thus, the surface transformed empty spaces do not cause additional stress in the substrate or a tendency for the substrate to crack.

The surface of the substrate will be smooth after the surface transformed empty spaces are formed if the initial cylinder length (L) is equal to an integer of a critical length ($\lambda_c$) such as $1 \times \lambda_c$ to form one sphere, $2 \times \lambda_c$ to form two spheres, $3 \times \lambda_c$ to form three spheres, etc. If the cylinder length (L) is not equal to an integer of a critical length ($\lambda_c$), then the surface of the substrate will have dimples caused by air in the cylinder attributable to the length beyond an integer of a critical length ($\lambda_c$). That is, for a given length L and $\lambda_c$, the number of spheres formed is the integer of $L/\lambda_c$, and the remainder of $L/\lambda_c$ contributes to the dimples on the surface of the substrate. Dimples formed on the surface can be removed using a polishing process, for example.

FIGS. 13A-13E illustrate the formation of empty spheres from initial cylindrical holes with the same radii and with varying length. Initial cylindrical holes are represented using dashed lines 1321. These initial cylindrical holes 1321 have the same radius ($R_C$) and are drilled or otherwise formed to different depths as represented by FIGS. 13A, 13B, 13C, 13D and 13E. The resulting surface-transformed spheres 1323 are illustrated with a solid line, as are the surface dimples 1326 that form when the cylindrical hole depth is not an integer multiple of $\lambda_C$. These surface dimples can be removed using a simple polishing process to leave a smooth surface with uniform and closed spherical voids within the material. The vertical position and number of the spherical voids is determined by the depth of the initial cylindrical holes.

In various embodiments of the present subject matter, the cellular substrate is formed by appropriately spacing the holes such that, upon annealing the material to provide the surface transformation process, the voids are uniformly spaced (or approximately uniformly spaced) throughout the volume of the cellular material. The uniformly spaced voids provide the cellular material with a uniform density from a macroscopic level and a uniform flexibility across a wafer.

Figure 14:
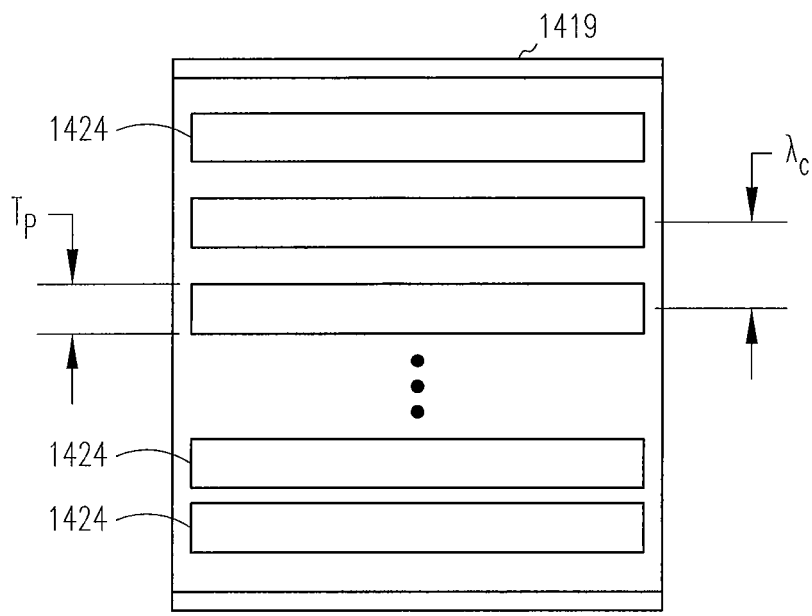
FIG. 14 illustrates a wafer with a surface-transformation-formed stack of empty plates with a large filling factor or low density, according to various embodiments of the present invention.

In various embodiments, it is desirable to provide a cellular substrate with a very low density within appropriate constraints for the ability to withstand various strain forces. FIG. 14 illustrates a wafer with a surface-transformation-formed stack of empty plates with a large filling factor or low density, according to various embodiments of the present invention. For example, the illustrated filling factor is approximately equal to 0.78, which provides a relatively high porosity and a relatively low density. In the illustrated example, the surface transformation produces a vertical stack of empty plates 1424 in the substrate 1419. The number of empty plates formed depends on the length of the holes. From Equation No. 16, it is determined that the thickness $T_P$ of the empty plate has a maximum value of $6.95 \times R_C$ when $D_{NT}$ is near the minimum allowed value of $2 \times R_C$ as inferred from Equation No. 14. From Equation No. 13, the center-to-center spacing ($\lambda$) of empty plates is $8.89 \times R_C$. It can be calculated that f≈0.78. Thus, it is expected to be able to use surface transformation to form a cellular substrate with a density of less than one fourth that of a solid volume of material.

Figure 15A:
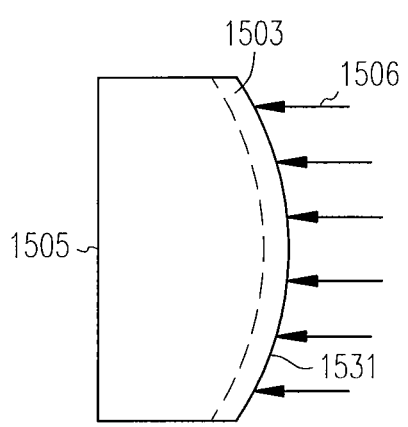
FIGS. 15A-15C illustrate a process for straining a semiconductor layer by performing a bond-cut process to bond a relaxed bow-shaped semiconductor layer to and flatten the semiconductor layer against a rigid substrate, according to various embodiments of the present invention.
Figure 15B:
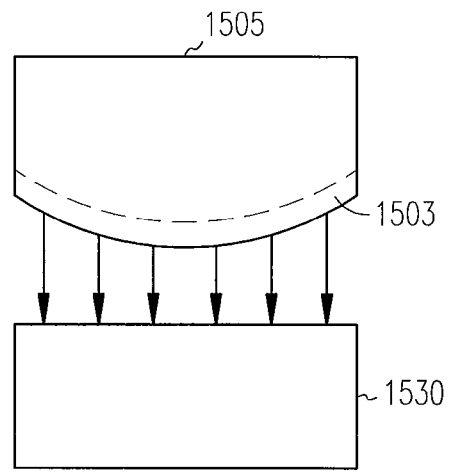
Figure 15C:
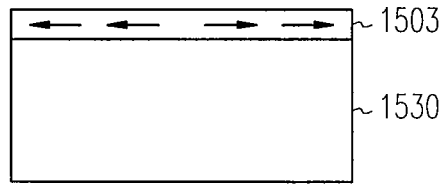
Figure 16A:
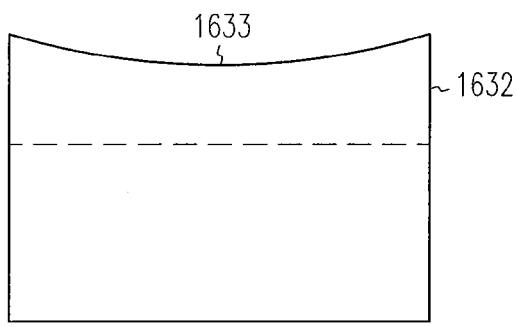
FIGS. 16A-16D illustrate a process for straining a semiconductor layer by bonding a concave surface of a crystalline wafer to a rigid substrate, according to various embodiments of the present invention.
Figure 16B:
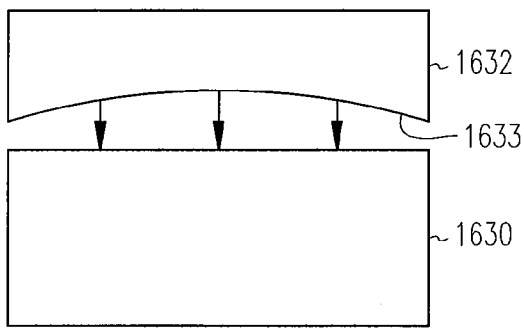
Figure 16C:
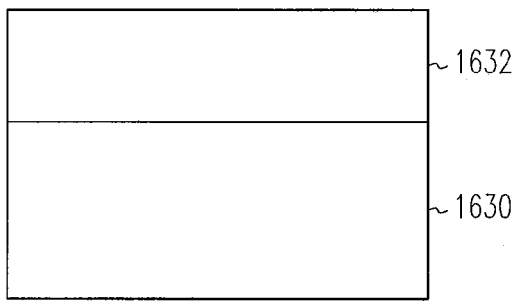
Figure 16D:
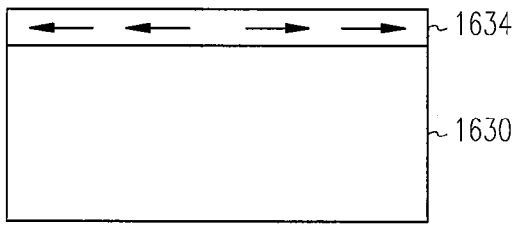

4. Bond Relaxed Ultra-Thin Semiconductor Membrane with Bowed Shape to Rigid Substrate FIGS. 15A-15C illustrate a process for straining a semiconductor layer by performing a bond-cut process to bond a relaxed bow-shaped semiconductor layer to and flatten the semiconductor layer against a rigid substrate, according to various embodiments of the present invention. In various embodiments, an ultra-thin membrane 1503, such as ultra-thin silicon, is bowed when cut from the crystalline sacrificial wafer 1505 and attached to a rigid substrate 1530. One method to achieve this is to polish or otherwise form the single crystal sacrificial wafer 1503 such that the top surface of the crystal has a curved or contoured surface 1531. Thin or ultra-thin slices are cut from the crystal using a bond-cut process, including an ion implant 1506, such as was discussed and illustrated with respect to FIGS. 5A-5D. In a relaxed free state, these thin membranes 1503 have a bowed shape. The naturally bowed membrane 1503 is flexed to straighten or flatten it, such that intrinsic strain is introduced in this thin membrane. The thin bowed wafer is bonded to a regular flat unstrained wafer 1530. The strain in the resulting strained membrane is controlled by controlling the direction and amount of the curved surface 1531 of the sacrificial wafer 1505.

5. Bond Single Crystal Wafer with Relaxed Concave Surface to Rigid Substrate

FIGS. 16A-16D illustrate a process for straining a semiconductor layer by bonding a concave surface of a crystalline wafer to a rigid substrate, according to various embodiments of the present invention. In various embodiments, a regular thickness single crystalline wafer 1632 is cut or otherwise provided with a concave surface 1633. This wafer 1632 is also under strain when straightened and bonded to a regular thickness unstrained wafer 1630, such as a silicon wafer. In various embodiments, the strained wafer 1632 is further thinned after bonding to control the strain.

6. Methods of Straining a Semiconductor Layer at a Wafer Scale

Figure 17:
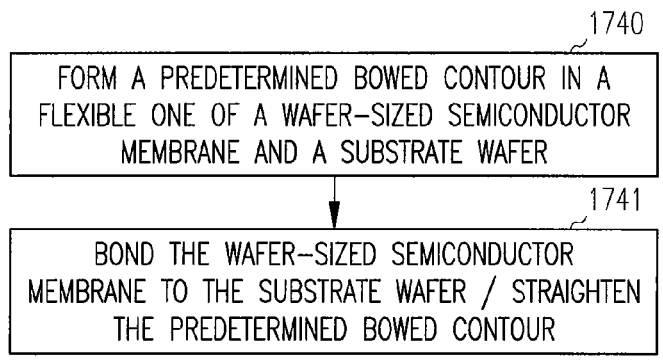
FIG. 17 illustrates a process for forming a wafer with a strained semiconductor layer, according to various embodiments of the present invention.

FIG. 17 illustrates a process for forming a wafer with a strained semiconductor layer, according to various embodiments of the present invention. At 1740, a predetermined bowed contour is formed in a flexible one of a wafer-sized semiconductor membrane and a substrate wafer. The wafer-sized semiconductor membrane is bonded to the substrate wafer and the predetermined bowed contour is straightened at 1741. The illustrated process performed at 1741 can occur in a single or in separate steps.

Figure 18:
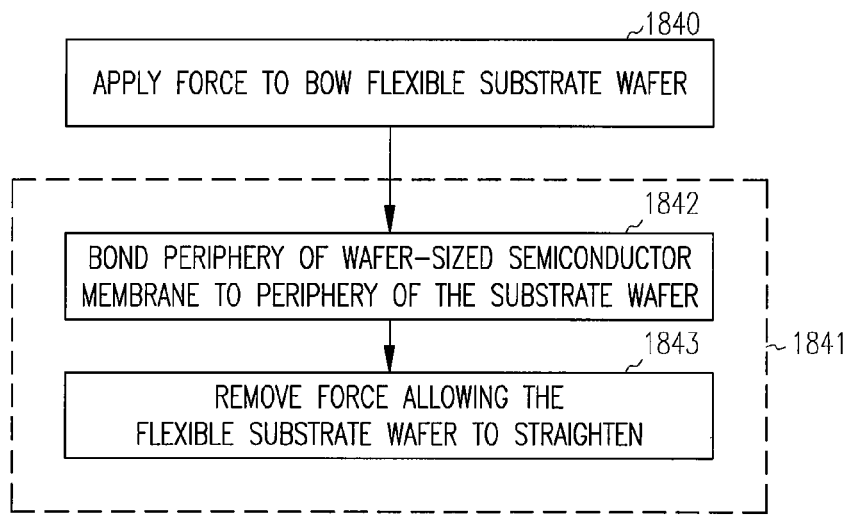
FIG. 18 illustrates a process for forming a wafer with a strained semiconductor layer, according to various embodiments of the process illustrated in FIG. 17.

FIG. 18 illustrates a process for forming a wafer with a strained semiconductor layer, according to various embodiments of the process illustrated in FIG. 17. At 1840, which generally corresponds to 1740 in FIG. 17, a force is applied to bow a flexible substrate wafer. At 1841, which generally corresponds to 1741 in FIG. 17, the periphery of a wafer-sized semiconductor membrane is bonded to the periphery of the substrate wafer 1842, and the force is removed to allow the flexible substrate wafer to straighten 1843. A slight bow may remain in the flexible substrate due to the strain in the semiconductor membrane.

Figure 19:
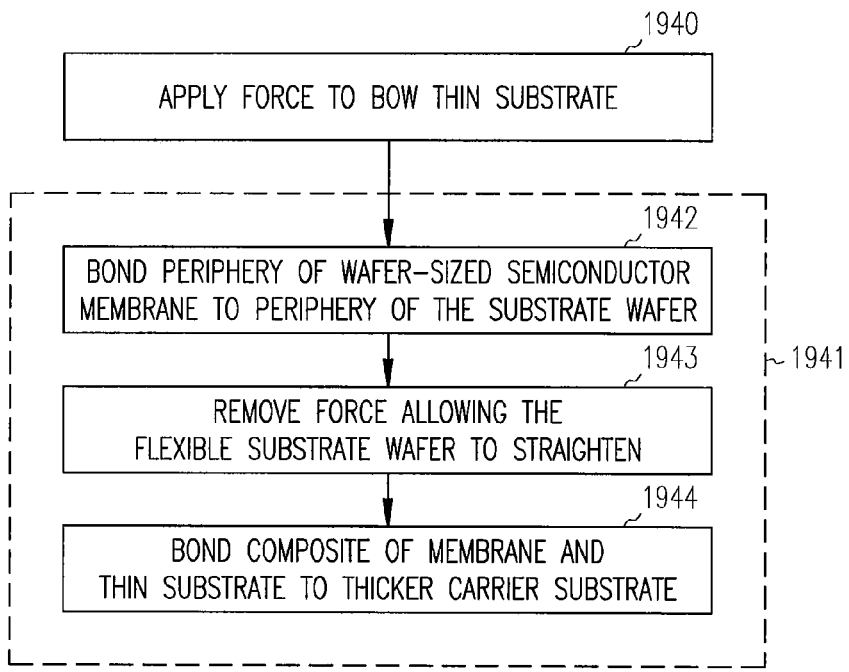
FIG. 19 illustrates a process for forming a wafer with a strained semiconductor layer, according to various embodiments of the process illustrated in FIG. 17.

FIG. 19 illustrates a process for forming a wafer with a strained semiconductor layer, according to various embodiments of the process illustrated in FIG. 17. At 1940, which generally corresponds to 1740 in FIG. 17, a force is applied to bow a flexible substrate wafer. At 1941, which generally corresponds to 1741 in FIG. 17, the periphery of a wafer-sized semiconductor membrane is bonded to the periphery of the substrate wafer 1942, the force is removed to allow the flexible substrate wafer to straighten 1943, and the composite of the membrane and thin substrate is bonded to a thicker carrier substrate 1944. A slight bow may remain in the flexible substrate due to the strain in the semiconductor membrane.

Figure 20:
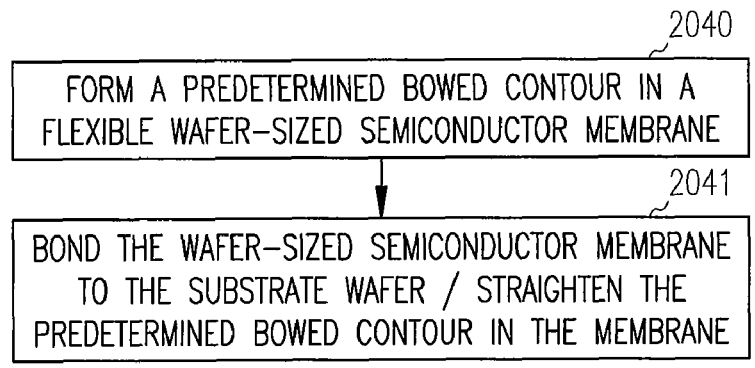
FIG. 20 illustrates a process for forming a wafer with a strained semiconductor layer, according to various embodiments of the process illustrated in FIG. 17.

FIG. 20 illustrates a process for forming a wafer with a strained semiconductor layer, according to various embodiments of the process illustrated in FIG. 17. At 2040, which generally corresponds to 1740 in FIG. 17, a predetermined bowed contour is formed in a flexible wafer-sized semiconductor membrane. At 2041, which generally corresponds to 1741 in FIG. 17, the wafer-sized semiconductor membrane is bonded to the substrate wafer and the bowed contour is straighten. The bonding and straightening can occur as a single or as multiple steps. A slight bow may remain in the flexible substrate due to the strain in the semiconductor membrane.

Figure 21:
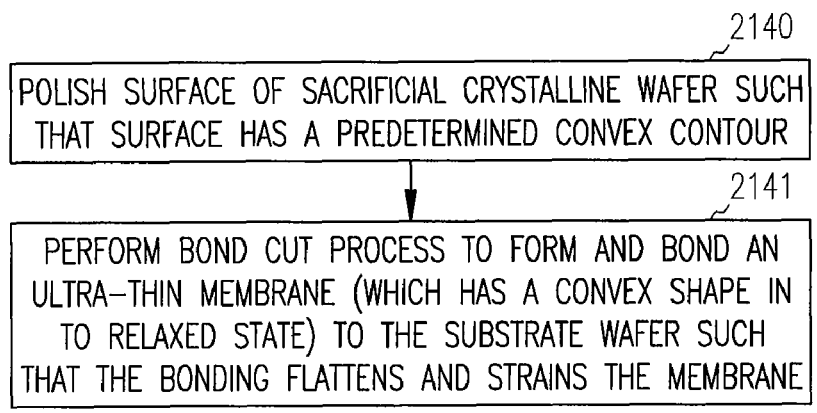
FIG. 21 illustrates a process for forming a wafer with a strained semiconductor layer, according to various embodiments of the process illustrated in FIG. 17.

FIG. 21 illustrates a process for forming a wafer with a strained semiconductor layer, according to various embodiments of the process illustrated in FIG. 17. At 2140, which generally corresponds to 2040 in FIG. 20, a surface of a sacrificial crystalline wafer is polished such that the surface has a predetermined convex contour. At 2141, which generally corresponds to 2041 in FIG. 20, a bond cut process is performed to form and bond an ultra-thin membrane to the substrate wafer. In a relaxed state, the ultra-thin membrane has a convex shape attributable to the polished surface of the sacrificial crystalline wafer. The bonded ultra-thin membrane is flattened, and thus is strained. A slight bow may remain in the flexible substrate due to the strain in the semiconductor membrane.

Figure 22:
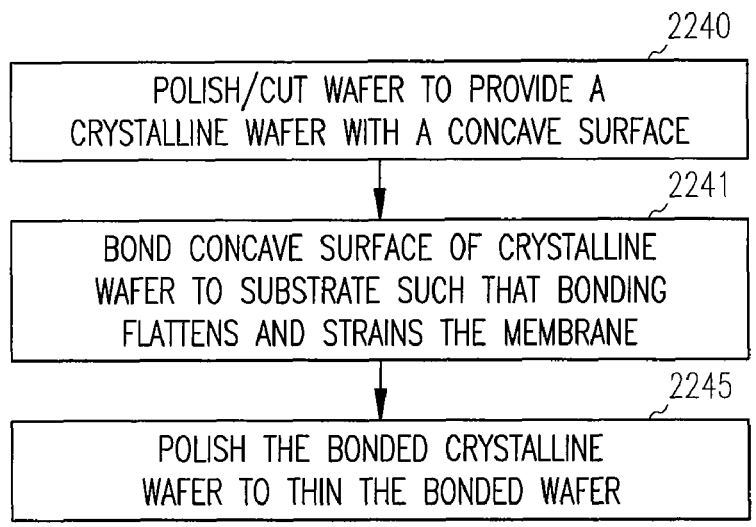
FIG. 22 illustrates a process for forming a wafer with a strained semiconductor layer, according to various embodiments of the process illustrated in FIG. 17.

FIG. 22 illustrates a process for forming a wafer with a strained semiconductor layer, according to various embodiments of the process illustrated in FIG. 17. At 2240, which generally corresponds to 2040 in FIG. 20, a crystalline wafer is polished, cut or otherwise processed to provide a crystalline wafer with a concave surface. At 2241, which generally corresponds to 2041 in FIG. 20, the concave surface of the crystalline wafer is bonded to the substrate wafer such that the bonding flattens and strains the membrane. At 2245, the bonded crystalline wafer is polished to thin the bond wafer and control the strain induced in the membrane.

7. Transistor

Figure 23:
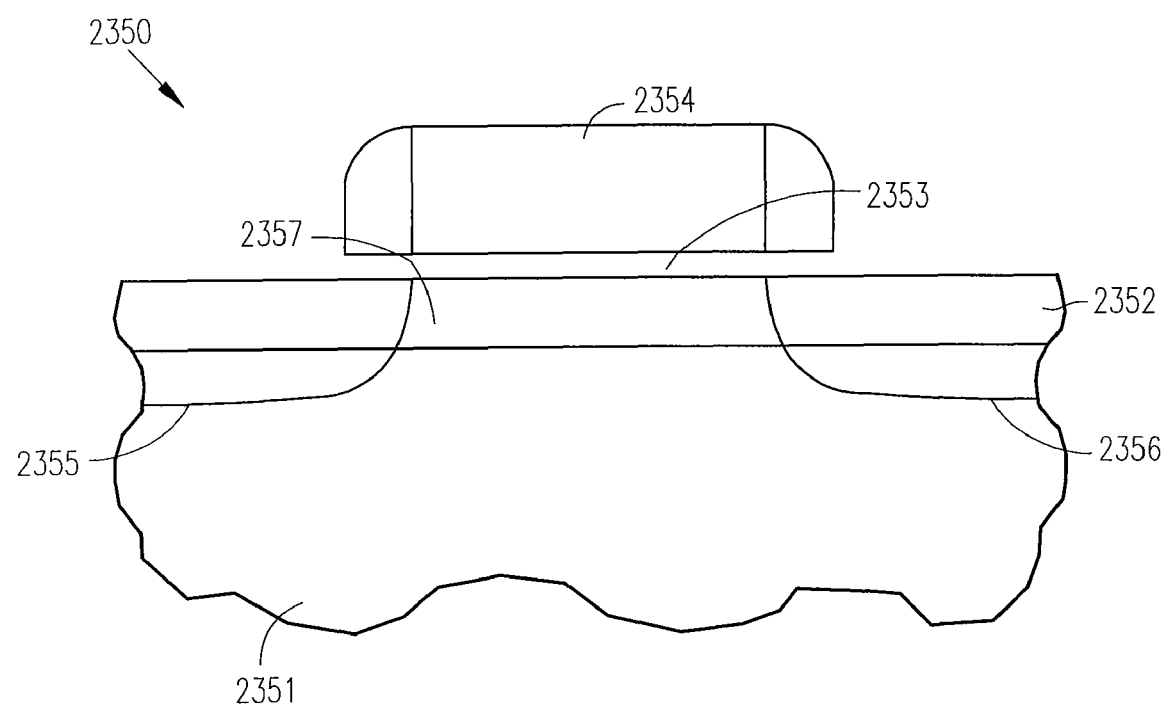
FIG. 23 illustrates a transistor fabricated with a strained semiconductor membrane, according to various embodiments of the present invention.

FIG. 23 illustrates a transistor fabricated with a strained semiconductor membrane, according to various embodiments of the present invention. The illustrated transistor 2350 includes a crystalline semiconductor substrate 2351, and a crystalline semiconductor membrane 2352 bonded to the substrate 2351 with a desired strain in accordance with this disclosure. A gate dielectric 2353 is formed on the strained membrane, and a gate 2354 is formed on the gate dielectric 2353. First and second diffusion regions 2355 and 2356 are formed. The strained semiconductor membrane 2352 between the first and second diffusion regions 2355 and 2356 forms a channel region 2357.

8. Systems

Figure 24:
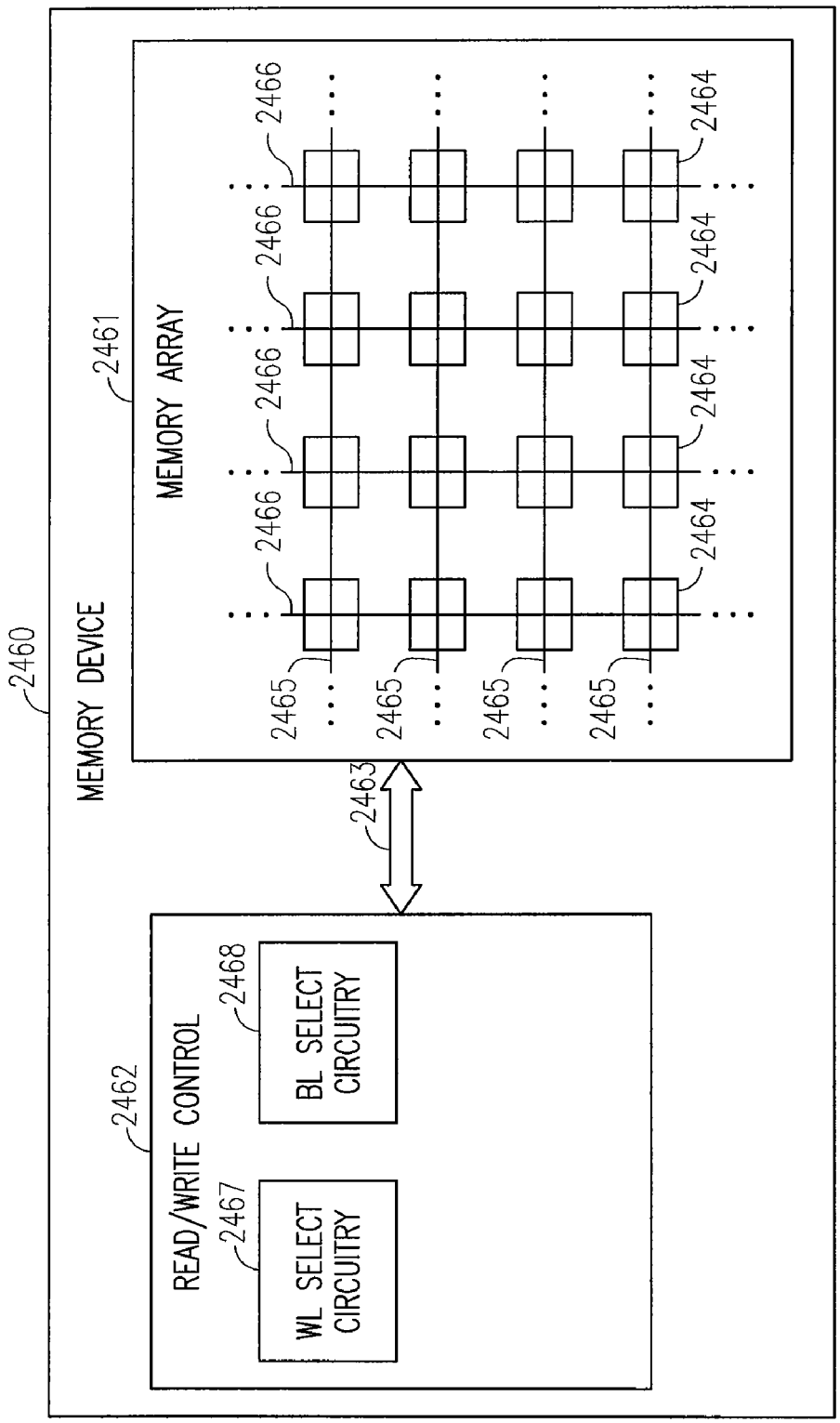
FIG. 24 illustrates a simplified block diagram of a high-level organization of a memory device, according to various embodiments of the present invention.

FIG. 24 is a simplified block diagram of a high-level organization of a memory device according to various embodiments of the present invention. The illustrated memory device 2460 includes a memory array 2461 and read/write control circuitry 2462 to perform operations on the memory array via communication line(s) 2463. The illustrated memory device 2460 may be a memory card or a memory module such as a single inline memory module (SIMM) and dual inline memory module (DIMM).

The memory array 2461 includes a number of memory cells 2464. The memory cells in the array are arranged in rows and columns. In various embodiments, word lines 2465 connect the memory cells in the rows, and bit lines 2466 connect the memory cells in the columns. The read/write control circuitry 2462 includes word line select circuitry 2467, which functions to select a desired row. The read/write control circuitry 2462 further includes bit line select circuitry 2468, which functions to select a desired column.

Figure 25:
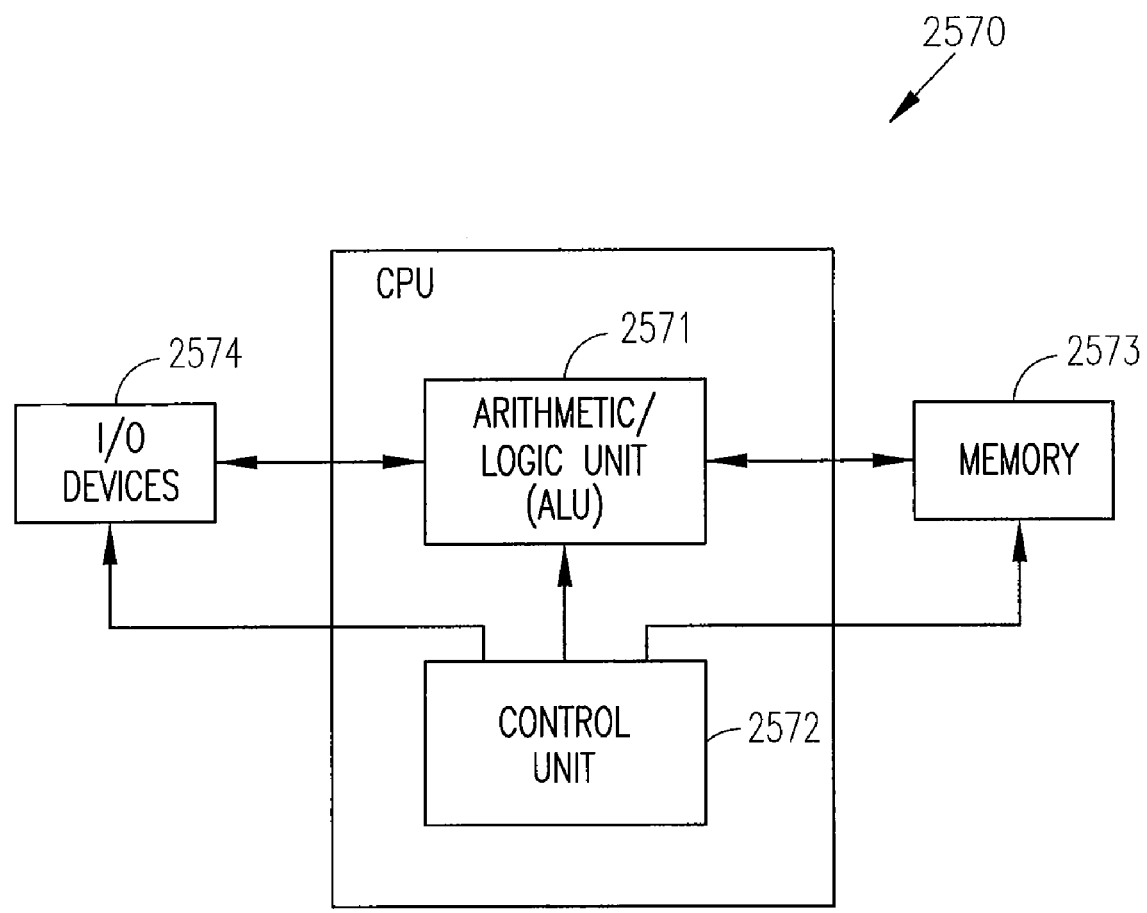
FIG. 25 illustrates a simplified block diagram of a high-level organization of an electronic system according to various embodiments of the present invention.

FIG. 25 illustrates a simplified block diagram of a high-level organization of an electronic system according to various embodiments of the present invention. In various embodiments, the system 2570 is a computer system, a process control system or other system that employs a processor and associated memory. The electronic system 2570 has functional elements, including a processor or arithmetic/logic unit (ALU) 2571, a control unit 2572, a memory device unit 2573 (such as illustrated in FIG. 24) and an input/output (I/O) device 2574. Generally such an electronic system 2570 will have a native set of instructions that specify operations to be performed on data by the processor 2571 and other interactions between the processor 2571, the memory device unit 2573 and the I/O devices 2574. The control unit 2572 coordinates all operations of the processor 2571, the memory device 2573 and the I/O devices 2574 by continuously cycling through a set of operations that cause instructions to be fetched from the memory device 2573 and executed. According to various embodiments, the memory device 2573 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated on wafers with a full wafer-bonded, mechanically strained semiconductor layer, in accordance with various embodiments of the present invention.

The illustration of the system 2570 is intended to provide a general understanding of one application for the structure and circuitry, and is not intended to serve as a complete description of all the elements and features of an electronic system according to the various embodiments of the present invention. As one of ordinary skill in the art will understand, such an electronic system can be fabricated in single-package processing units, or even on a single semiconductor chip, in order to reduce the communication time between the processor and the memory device.

Applications containing memory cells as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

Various embodiments disclosed herein provide strained semiconductor layers by mechanically stretching a semiconductor layer during full wafer-bonding. This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A wafer structure, comprising:
a substrate wafer having a surface and having a predetermined Youngs modulus of elasticity and a predetermined thickness to provide the substrate wafer with a desired flexibility to bow from a relaxed position in which the surface is substantially flat into a flexed position under a predetermined force in which the surface is not substantially flat; and
a wafer-sized strained semiconductor layer bonded to the surface of the substrate wafer, the strained semiconductor layer having a strain induced by relaxing the substrate wafer from the flexed position in which the surface is not substantially flat toward the relaxed position in which the surface is substantially flat.

2. The wafer structure of claim 1, further comprising a carrier substrate, wherein the substrate wafer is bonded to the carrier substrate.

3. The wafer structure of claim 1, wherein the semiconductor layer has a strain greater than 0.5%.

4. The wafer structure of claim 1, wherein the semiconductor layer has a strain within a range between approximately 0.75% and approximately 1.5%.

5. A wafer structure, comprising:
a substrate wafer having a surface and having a peripheral region; and
a strained semiconductor layer having a peripheral region bonded to the peripheral region of the substrate wafer and a central region within the peripheral region, wherein the central region has a strain induced by relaxing the substrate wafer from a flexed position in which the surface of the substrate wafer is not substantially flat toward a relaxed position in which the surface of the substrate wafer is substantially flat.

6. The wafer structure of claim 5, wherein the strained semiconductor layer includes silicon.

7. The wafer structure of claim 5, wherein the strained semiconductor layer includes an ultra-thin semiconductor layer.

8. The wafer structure of claim 5, wherein the strained semiconductor layer includes a semiconductor layer having a thickness between approximately 300 Å and approximately 1000 Å.

9. The wafer structure of claim 5, wherein the strained semiconductor layer includes a strained silicon layer having a strain within a range between approximately 0.75% to approximately 1.5%.

10. The wafer structure of claim 5, wherein the substrate wafer is selected from the group comprising: glass, quartz, silicon oxycarbide glass, aluminum oxycarbide glass, and silicon.

11. The wafer structure of claim 5, wherein the substrate wafer includes voids to provide the substrate wafer with a desired flexibility.

12. The wafer structure of claim 5, wherein the substrate wafer includes a predetermined arrangement of voids formed by surface transformation to provide the substrate wafer with a desired flexibility.

13. A wafer structure, comprising:
a substrate wafer having a surface and having a periphery and a desired flexibility to bow from a relaxed position in which the surface is substantially flat into a flexed position in which the surface is not substantially flat under a predetermined force; and
a semiconductor layer having a peripheral region bonded to the peripheral region of the substrate wafer and a strained central region within the peripheral region, wherein the central region has a strain induced by relaxing the substrate wafer from a flexed position in which the surface is not substantially flat to a relaxed position in which the surface is substantially flat.

14. The wafer structure of claim 13, wherein the semiconductor layer includes a semiconductor layer having a thickness between approximately 300 Å and approximately 1000 Å.

15. The wafer structure of claim 13, wherein the central region has a strain within a range between approximately 0.75% to approximately 1.5%.

16. A wafer structure, comprising:
a substrate wafer having a periphery, a plurality of voids, and a desired flexibility to bow from a relaxed position into a flexed position under a predetermined force; and
a semiconductor layer having a peripheral region bonded to the peripheral region of the substrate wafer and a strained central region within the peripheral region.

17. The wafer structure of claim 16, wherein the plurality of voids includes a spherical void.

18. The wafer structure of claim 16, wherein the plurality of voids includes a pipe-shaped void.

19. The wafer structure of claim 16, wherein the plurality of voids includes a plate-shaped void.

20. The wafer structure of claim 16, wherein the central region has a strain within a range between approximately 0.75% to approximately 1.5%.

* * * * *